US006045864A

United States Patent [19]

Lyons et al.

[11] Patent Number: 6,045,864

[45] Date of Patent: Apr. 4, 2000

[54] VAPOR COATING METHOD

[75] Inventors: Christopher S. Lyons, St. Paul; Constantin I. Ruta, White Bear Lake; Robert J. Fleming, Lake Elmo; Russell E. Blette, Hastings; Robin E. Wright, Inver Grove Heights; Jeffrey H. Tokie, Scandia, all of Minn.

[73] Assignee: 3M Innovative Properties Company, St. Paul, Minn.

[21] Appl. No.: 08/980,947

[22] Filed: Dec. 1, 1997

[51] Int. Cl.[7] .......... C23C 16/00

[52] U.S. Cl. .......... 427/255.23; 427/255.28; 427/255.6; 427/509; 427/565

[58] Field of Search .......... 427/248.1, 255.23, 427/565, 509, 255.6, 255.28

[56] References Cited

U.S. PATENT DOCUMENTS

| | | | |
|---|---|---|---|
| 3,374,111 | 3/1968 | Brennemann | 117/212 |
| 3,379,803 | 4/1968 | Tittmann et al. | 264/81 |
| 3,518,111 | 6/1970 | Wright et al. | 117/93.31 |
| 3,547,683 | 12/1970 | Williams et al. | 117/93.31 |
| 3,665,269 | 5/1972 | Wright et al. | 317/258 |
| 3,840,391 | 10/1974 | Spitz et al. | 117/106 R |
| 4,076,866 | 2/1978 | Platakis et al. | 427/250 |
| 4,080,926 | 3/1978 | Platakis et al. | 118/5 |
| 4,104,438 | 8/1978 | Angelo et al. | 428/332 |
| 4,290,384 | 9/1981 | Ausschnitt et al. | 118/722 |
| 4,325,986 | 4/1982 | Baron et al. | 427/74 |
| 4,499,520 | 2/1985 | Cichanowski | 361/311 |
| 4,543,275 | 9/1985 | Akashi et al. | 427/250 |
| 4,624,867 | 11/1986 | Iijima et al. | 427/255.6 |
| 4,675,270 | 6/1987 | Woods et al. | 430/311 |
| 4,682,565 | 7/1987 | Carrico | 118/719 |
| 4,696,719 | 9/1987 | Bischoff | 202/205 |
| 4,722,515 | 2/1988 | Ham | 261/142 |
| 4,734,227 | 3/1988 | Smith | 264/13 |
| 4,734,451 | 3/1988 | Smith | 524/493 |
| 4,771,946 | 9/1988 | Moy et al. | 239/122 |
| 4,842,893 | 6/1989 | Yializis et al. | 427/44 |
| 4,891,249 | 1/1990 | McIntyre | 427/421 |
| 4,913,865 | 4/1990 | Toyotama | 264/81 |
| 4,954,371 | 9/1990 | Yializis | 427/44 |
| 5,018,048 | 5/1991 | Shaw et al. | 361/323 |
| 5,024,879 | 6/1991 | Massa et al. | 428/304.4 |
| 5,032,461 | 7/1991 | Shaw et al. | 428/461 |
| 5,090,985 | 2/1992 | Soubeyrand et al. | 65/60.52 |
| 5,097,800 | 3/1992 | Shaw et al. | 118/730 |
| 5,125,138 | 6/1992 | Shaw et al. | 29/25.42 |
| 5,156,881 | 10/1992 | Okano et al. | 427/572 |
| 5,190,592 | 3/1993 | Chazee | 118/719 |
| 5,229,171 | 7/1993 | Donovan et al. | 427/483 |
| 5,261,949 | 11/1993 | Schilling | 95/216 |
| 5,271,957 | 12/1993 | Wernberg et al. | 427/109 |
| 5,316,579 | 5/1994 | McMillan et al. | 118/50 |
| 5,383,970 | 1/1995 | Asaba et al. | 118/726 |
| 5,421,895 | 6/1995 | Tsubouchi et al. | 118/726 |
| 5,431,736 | 7/1995 | Boer | 118/726 |
| 5,440,446 | 8/1995 | Shaw et al. | 361/301.5 |

(List continued on next page.)

FOREIGN PATENT DOCUMENTS

| | | |
|---|---|---|
| 0 733 919 A2 | 9/1996 | European Pat. Off. . |
| 2297900 | 8/1976 | France . |
| WO 95/10117 | 4/1995 | WIPO . |
| WO 96/31571 | 10/1996 | WIPO . |
| WO 98/55668 | 12/1998 | WIPO . |

*Primary Examiner*—Roy V. King
*Attorney, Agent, or Firm*—Douglas B. Little

[57] ABSTRACT

Coating system and method that allows coatings to be formed from a wide variety of coatable compositions that are entirely free of any solvents or, alternatively, have relatively little solvent in minor amounts effective to help dissolve one or more components of such compositions. A fluid composition is atomized and contacted with a carrier gas. The contacting occurs under conditions such that vaporization of substantially all of the atomized fluid composition occurs so as to form a vapor having a condensation temperature. The vapor is caused to flow to the surface of the substrate. The surface is at a temperature below the condensation temperature of the vapor. Consequently, the vapor condenses onto the surface to form the coating.

40 Claims, 10 Drawing Sheets

U.S. PATENT DOCUMENTS

| | | | |
|---|---|---|---|
| 5,478,014 | 12/1995 | Hynds | 239/135 |
| 5,492,724 | 2/1996 | Klinedinst et al. | 427/248.1 |
| 5,506,008 | 4/1996 | Klumpp et al. | 427/515 |
| 5,540,772 | 7/1996 | McMillan et al. | 118/50 |
| 5,540,959 | 7/1996 | Wang | 427/561 |
| 5,547,708 | 8/1996 | Asaba et al. | 427/248.1 |
| 5,595,603 | 1/1997 | Klinedinst et al. | 118/715 |
| 5,607,789 | 3/1997 | Treger et al. | 429/90 |
| 5,630,878 | 5/1997 | Miyamoto et al. | 118/715 |
| 5,653,813 | 8/1997 | Benzing et al. | 118/726 |
| 5,681,615 | 10/1997 | Affinito | 427/255.6 |
| 5,711,994 | 1/1998 | Powers | 427/255.6 |
| 5,882,416 | 3/1999 | Van Buskirk et al. | 118/726 |

VAPOR COATING METHOD

FIELD OF THE INVENTION

This invention relates to an apparatus and method for generating and condensing a vapor onto a substrate to form a coating. More specifically, this invention relates to such an apparatus and method in which the vapor is generated from an atomized mist comprising the materials to be coated.

BACKGROUND OF THE INVENTION

Coatings are applied to a wide variety of substrates for widely divergent purposes. Just a few examples of the many different types of coatings include adhesive coatings, primer coatings, decorative coatings, protective hard coatings, varnish coatings, antireflective coatings, reflective coatings, interference coatings, release coatings, dielectric coatings, photoresist coatings, conductive coatings, nonlinear optic coatings, electrochromic/electroluminescent coatings, barrier coatings, biologically-active coatings, biologically inert coatings, and the like. Such coatings can be applied to substrates that are made from many different materials and have many different shapes. For example, in terms of materials, substrates can be metal, wood, cloth, polymeric, ceramic, paper, mineral, glass, composite, and the like. In terms of shape, substrates can be flat, curved, undulating, twisted, microstructured, smooth, rough, porous, particulate, fibrous, hollow shaped, three-dimensional, regular or irregular surfaced, and the like.

In conventional industrial coating processes, an admixture (which can be an emulsion, solution, slurry, two-phase fluid mixture, and the like) comprising the coating constituents and a suitable solvent is applied to the substrate using a suitable coating technique such as spraying, roll coating, brush coating, spin coating, or the like. The coated composition then is typically dried and cured in order to solidify the coating. During drying, the solvent is removed from the coating and then discarded into the environment or recovered.

The solvent is generally an essential component of the coating composition for a variety of reasons. First, the solvent helps ensure that the coating composition has a suitable coating viscosity. The solvent also helps ensure that the coating composition can be applied to the substrate evenly to form a uniform coating. The solvent may also provide the composition with an acceptable shelf-life.

The presence of the solvent, however, has many drawbacks. If the solvent is to be discarded after use, the solvent becomes waste in the environment. This is particularly problematic if the solvent is hazardous. Indeed, disposal of hazardous solvents tends to involve expensive and elaborate disposal schemes regulated by governmental authorities in an effort to minimize harm to the environment resulting from the disposal. Solvent recovery, therefore, is often preferred to solvent disposal. However, solvent recovery, like solvent disposal, also suffers from several disadvantages. Firstly, solvent recovery tends to require expensive, capital intensive procedures and equipment. Sometimes, the materials used to clean a solvent are hazardous wastes themselves.

In short, the need to handle the solvents from coating operations is a serious burden in industry. Accordingly, it would be desirable to find a way to carry out coating operations with minimal solvent, or more preferably, in solventless fashion, to avoid the burden of having to dispose of, or recover, left-over solvent. It would also be desirable to find a way to accomplish this for a wide variety of different coating compositions.

SUMMARY OF THE INVENTION

The present inventors have now discovered an extremely versatile coating system and method that allows coatings to be formed from a wide variety of coatable compositions that are entirely free of any solvents or have relatively little solvent in amounts effective to help dissolve one or more components of such compositions. This eliminates all of the environmental drawbacks and concerns associated with solvents used in conventional coating processes.

The present invention is based upon the concept of atomizing a fluid coating composition, which preferably is solvent-free, to form a plurality of fine liquid droplets. The droplets are contacted with a carrier gas, which causes the droplets to vaporize even at temperatures well below the boiling point of the droplets. Vaporization occurs quickly and completely, because the partial pressure of the vapor in admixture with the carrier gas is still well below the vapor's saturation pressure. When the gas is heated, the gas provides the thermal/mechanical energy for vaporization.

After vaporization, the vapor flows to the substrate to be coated. The substrate is maintained at a temperature well below the condensation point of the vapor. This causes the vapor to condense as a thin, uniform, substantially defect-free coating that can be subsequently cured, if desired, by various curing mechanisms. The coating may be continuous or discontinuous. The present invention is particularly useful for forming thin films having a thickness in the range from about 0.001 $\mu$m to about 5 $\mu$m. Thicker coatings can be formed by increasing the exposure time of the substrate to the vapor, increasing the flow rate of the fluid composition, increasing the temperature of the carrier gas, and/or increasing the pressure of the carrier gas. For flexible web substrates, increasing the exposure time of the substrate to the vapor can be achieved by adding multiple vapor sources to the system or by decreasing the speed of the web through the system. Layered coatings of different materials can be formed by sequential coating depositions using a different coating material with each deposition.

The principles of the present invention may be practiced in a vacuum. Advantageously, however, atomization, vaporization, and coating can occur at any desired pressure, including ambient pressure. This avoids the need to rely upon costly vacuum chambers commonly used in previously known vapor coating processes. As another advantage, atomization, vaporization, and coating can occur at relatively low temperatures, so that temperature sensitive materials can be coated without degradation that might otherwise occur at higher temperatures. The present invention is also extremely versatile. Virtually any liquid material, or combination of liquid materials, having a measurable vapor pressure can be used to form coatings.

Generally, atomization of the fluid coating composition can be accomplished using any atomization technique known in the art, including ultrasonic atomization, spinning disk atomization, and the like. In particularly preferred embodiments, atomization is achieved by energetically colliding a stream of the carrier gas with a stream of the fluid composition. Preferably, the carrier gas is heated, and the fluid stream flow is laminar at the time of collision. The energy of the collision breaks the preferably laminar flow fluid coating composition into very fine droplets. Using this kind of collision to achieve atomization is particularly advantageous, because it provides smaller atomized droplets with a narrower size distribution and a more uniform number density of droplets per volume than can be achieved using some other atomization techniques. Additionally, the resultant droplets are almost immediately in intimate contact with the carrier gas, resulting in rapid, efficient vaporization. Although the present invention may be used to carry out coating operations in a vacuum, the use of gas collision for atomization is less suitable for use in vacuum chambers because the carrier gas would tend to increase the pressure in the chamber.

In one aspect, the present invention relates to a method of forming a coating on at least a portion of a surface of a substrate. A stream of a carrier gas is caused to collide with a stream of a fluid composition. The collision occurs under conditions such that vaporization of substantially all of the fluid composition occurs so as to form a vapor having a condensation temperature. The vapor is caused to flow to the surface of the substrate due to the velocity and momentum of the carrier gas. The surface is at a temperature below the condensation temperature of the vapor. Consequently, the vapor condenses as a liquid on the surface to form the coating. Advantageously, the velocity and momentum of the carrier gas is imparted to the vapor, which is thereby forcibly driven into the substrate with sufficient force so as to help adhere the condensed coating to the substrate.

In another aspect of the invention for forming a coating on a substrate, a fluid composition is atomized and contacted with a carrier gas. The contacting occurs under conditions such that vaporization of substantially all of the atomized fluid composition occurs so as to form a vapor having a condensation temperature. The vapor is caused to flow to the surface of the substrate. The surface is at a temperature below the condensation temperature of the vapor. Consequently, the vapor condenses onto the surface to form the coating. In this aspect of the invention, the fluid stream and gas stream may be mixed together first, and then atomized using conventional atomizing means. In this way, the resultant atomized droplets of fluid would be in intimate admixture with the gas.

Alternatively, the fluid can be atomized using conventional atomizing means that ejects or otherwise sprays the atomized droplets into the carrier gas. As another alternative, atomization can be carried out by colliding two or more streams of the fluid in a manner such that the resultant atomized fluid droplets can be contacted with the carrier gas. As still another alternative, at least one fluid stream can be collided with at least one carrier gas stream in order to carry out atomizing and contacting, as a practical matter, in a single step.

In still yet another aspect, the present invention relates to a method of forming a polymeric coating on a substrate. The process of the previous paragraph is performed using a fluid composition comprising one or more polymeric precursor components.

In still yet another aspect, the present invention relates to a process of generating a vapor comprising the step of causing a stream of a fluid composition to collide with a stream of a carrier gas as described above.

The invention also relates to a coating apparatus, including a chamber having an inlet region in which a carrier gas is contacted with a multiplicity of atomized droplets of a fluid composition under conditions such that vaporization of substantially all of the fluid composition occurs to form a vapor having a condensation temperature. The apparatus includes an inlet end through which the fluid composition and the carrier gas enter the chamber. Atomization means is positioned proximal to the inlet end for generating a mist of the fluid composition in the chamber. A substrate support is provided having a chilled surface to support a substrate to be coated. The chilled surface is capable of reaching a temperature below the condensation temperature of the vapor. The chilled surface is positioned so that the vapor can flow to the chilled surface.

DETAILED DESCRIPTION OF THE PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

Figure 1A:
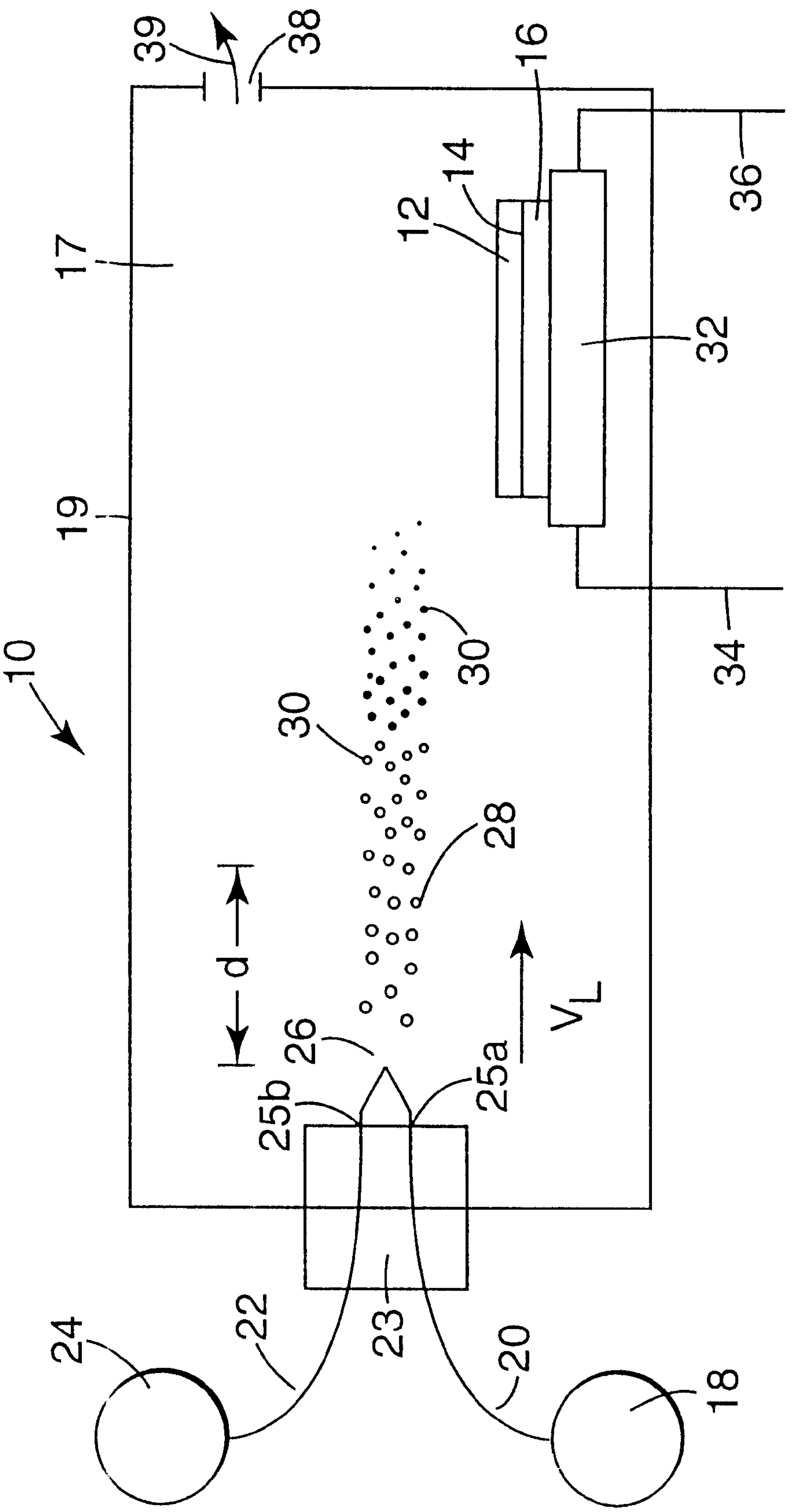
FIG. 1*a* is schematic representation of a coating system of the present invention using stream collision to achieve atomization.

FIG. 1*a* is a schematic representation of one embodiment of a system 10 of the present invention suitable for forming coating 12 on surface 14 of substrate 16, wherein coating 12 is formed from a supply of fluid composition 18. Generally, stream 20 of fluid composition 18 is collided with stream 22 of carrier gas 24 at collision point 26 within chamber 17. The energy of the collision atomizes fluid stream 20 and thus forms a mist of liquid droplets 28. For purposes of clarity, only one fluid stream 20 and one carrier gas stream 22 are shown. Alternatively, a plurality of fluid streams and/or carrier gas streams could be used and collided at one or more collision points sequentially or in concerted fashion if desired. Also, although substrate 16 is shown as being inside chamber 17 during coating operations, substrate 16 could be outside chamber 17 in some embodiments. However, in such embodiments, chamber 17 would be provided with a suitable orifice (not shown) through which vaporized fluid composition 18 could be directed onto substrate surface 14.

Advantageously, achieving atomization of fluid stream 20 under laminar flow conditions by colliding carrier gas stream 22 with laminar liquid stream 20 can provide liquid droplets 28 having a smaller average droplet size with a narrower particle size distribution and a more uniform number density than can be achieved using more conventional atomization techniques that rely upon ultrasonic atomizers, spinning disk atomizers, or the like, or that rely upon turbulent liquid flow conditions that tend to introduce volumetric variations in the droplet systems. This capability is particularly beneficial for forming thin, substantially defect-free coatings with uniform thickness.

The collision between streams 22 and 20 may occur under a wide range of conditions under which a substantial portion, preferably substantially all, and more preferably all of fluid stream 20 is atomized as a result of the collision. The collision of streams 22 and 20 preferably is carried out so that the collision results in liquid droplets 28 having an average droplet size of less than 200 micrometers, preferably less than 100 micrometers, more preferably less than 30 micrometers. Factors that might have a tendency to affect the droplet size include the geometry of streams 22 and 20, the velocities of streams 22 and 20 at the time of collision, the nature of fluid composition 18, and the like.

For example, streams 22 and 20 may be generated with a wide range of geometries with beneficial results. According to one representative approach as schematically shown in FIG. 1*a*, streams 22 and 20 may be generated as streams that are ejected towards each other at an angle between the streams in the range from about 10° to about 180°, preferably 15° to 135°, more preferably, about 30° to 60°, and most preferably 43° to 47°. In particular, streams 22 and 20 collided at an angle in the preferred range from 15° to 135° have a lateral component of velocity, designated by the arrow $V_L$, that helps motivate liquid droplets 28 and carrier gas 24 toward substrate 16 following collision. In the illustrated embodiment of FIG. 1*a*, fluid stream 20 and carrier gas stream 22 are generated by ejection through nozzle orifices 25*a* and 25*b* of nozzle 23. Nozzle orifice 25*a* and 25*b* may have any desired shape. For instance, streams 22 and 20 may be ejected from circularly shaped nozzle orifices, elliptical orifices, square orifices, rectangular orifices adapted to eject planar streams, orifices adapted to eject hollow streams, combinations of these, and the like.

Figure 5A:
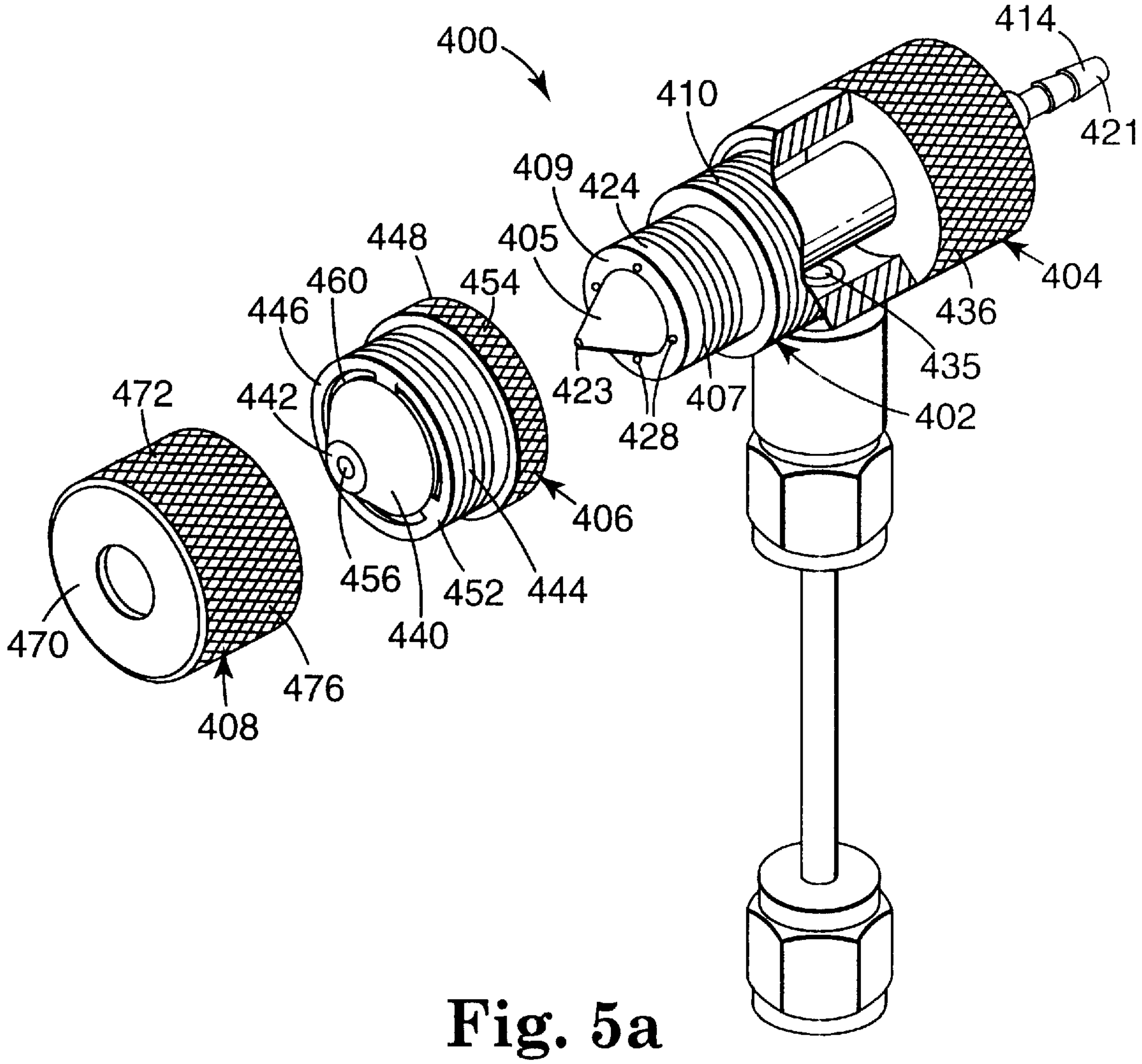
FIG. 5*a* is an exploded perspective view of a preferred nozzle embodiment of the present invention producing substantially total atomization.
Figure 5B:
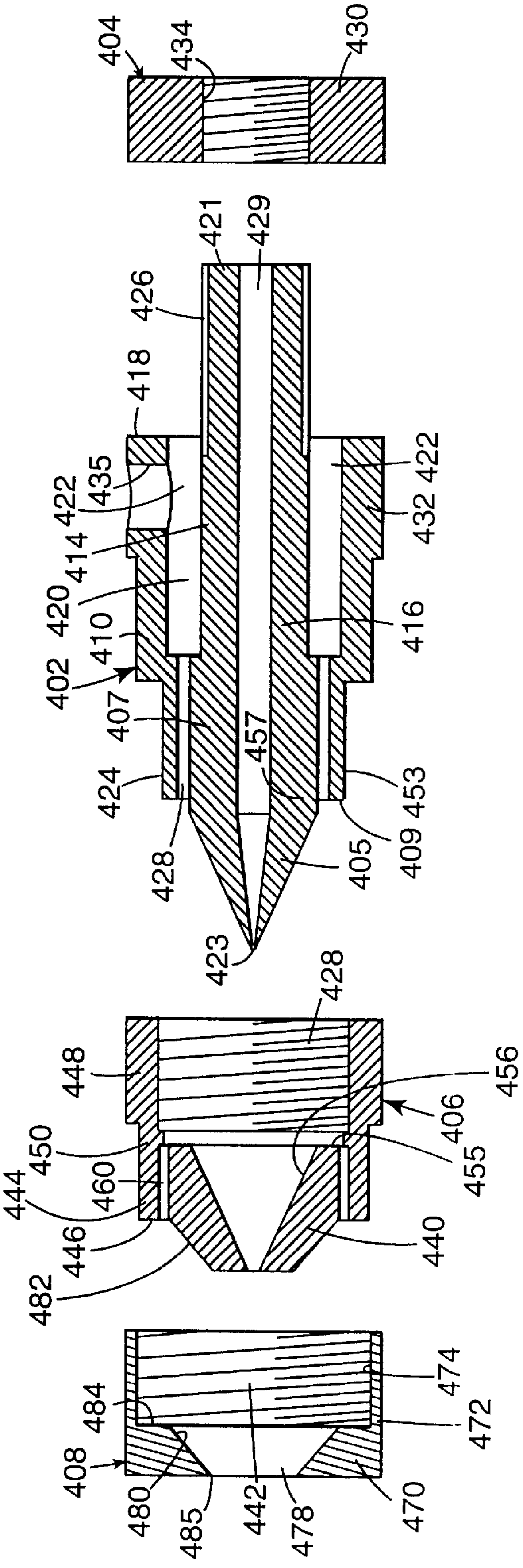
FIG. 5*b* is a side view, shown in cross-section of the exploded nozzle view of FIG. 5*a;*
Figure 5C:
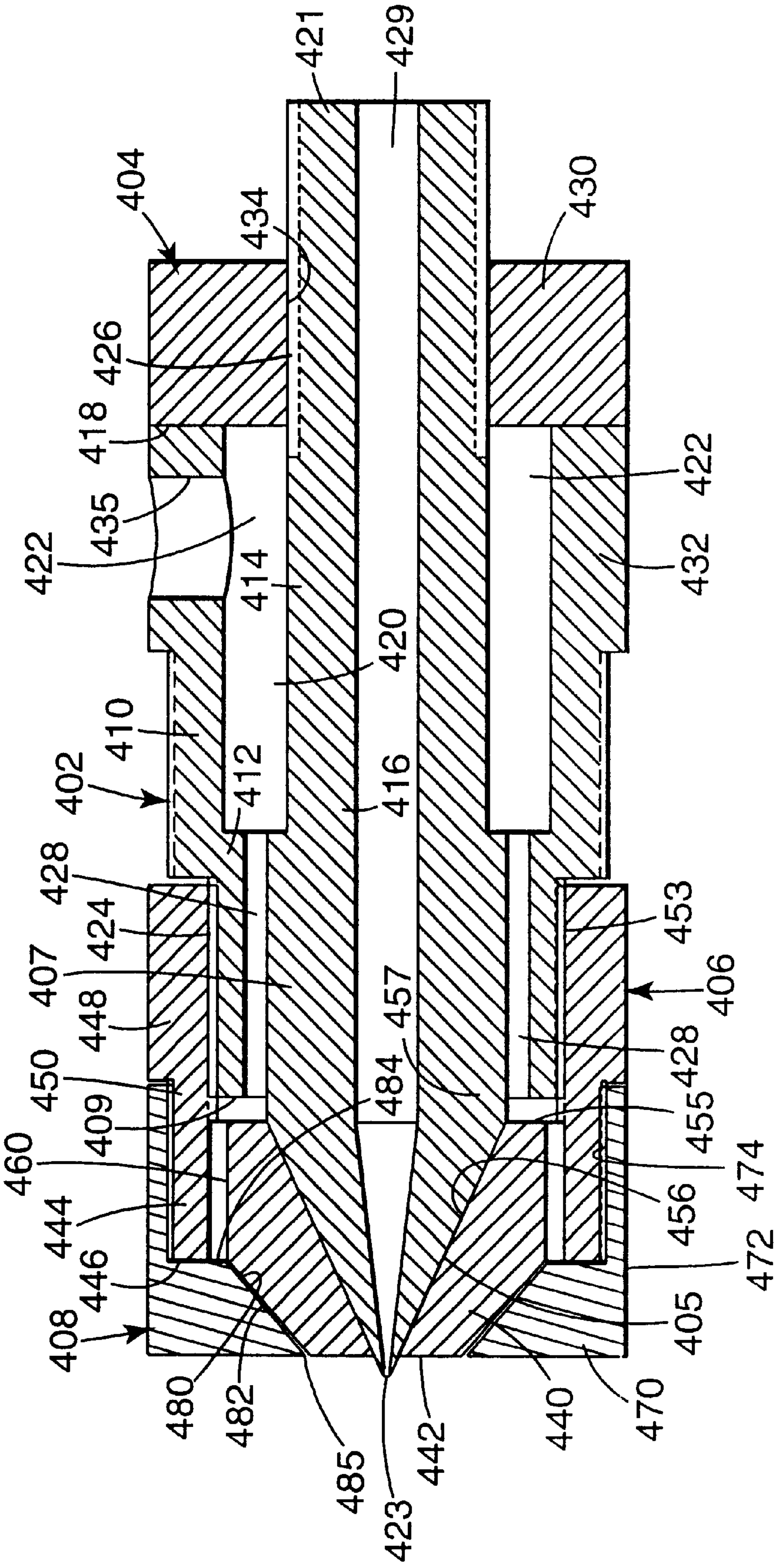
FIG. 5*c* is a side view, shown in cross-section, of the assembled nozzle of FIG. 5*a;*
Figure 7:
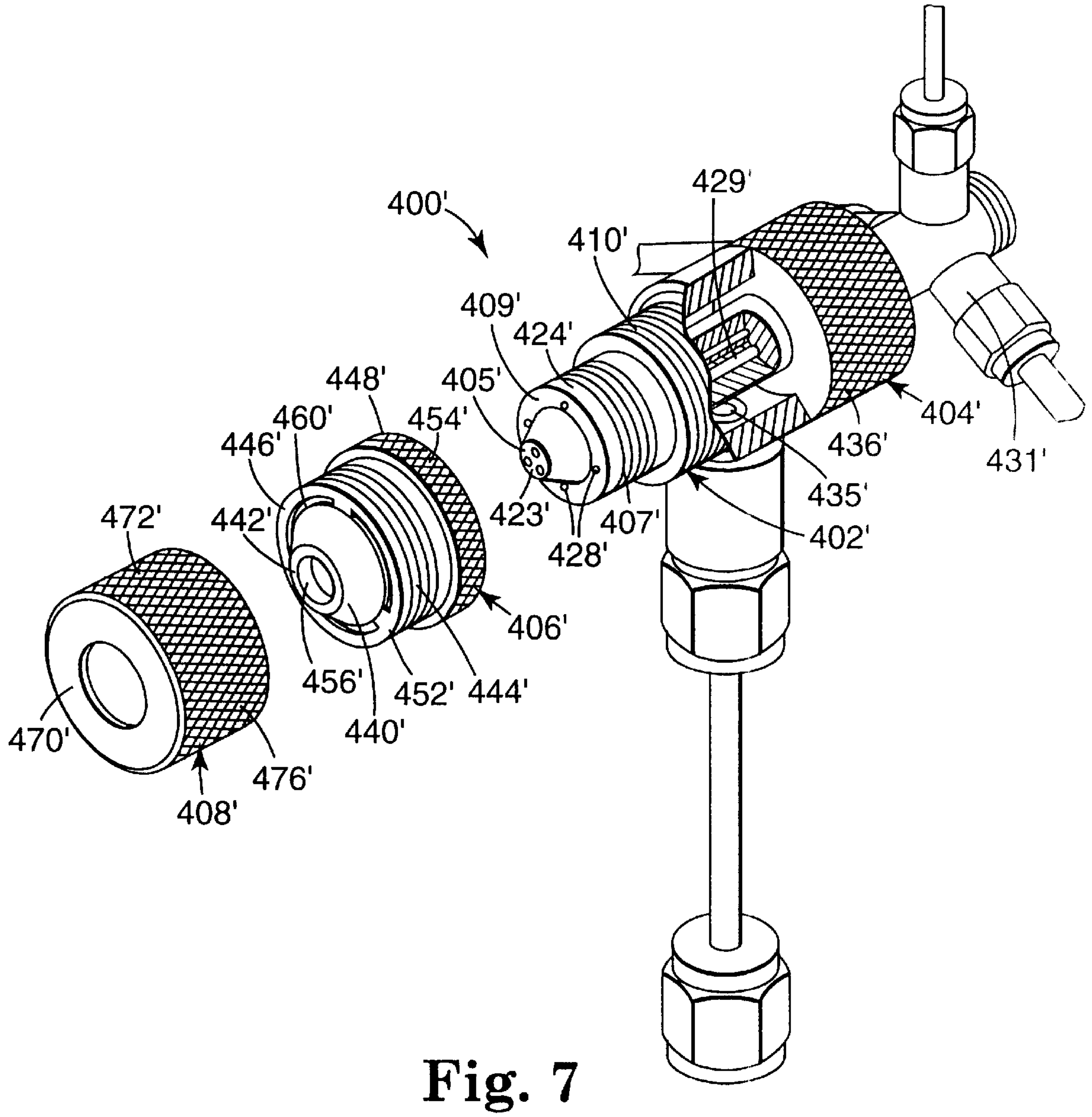
FIG. 7 is an exploded perspective view, with parts broken away, of another preferred nozzle embodiment of the present invention suitable for atomizing/vaporizing a plurality of fluid streams.

A wide variety of nozzle structures previously known for use in generating colliding streams for other applications could be used in the present invention to generate streams 22 and 20. Such nozzle structures have been described, for example, in Lefebvre, A. H., *Atomization and Sprays*, Hemisphere Publishing Corp., U.S.A. (1989); Harari et al., *Atomization and Sprays*, vol. 7, pp. 97–113 (1997). A particularly preferred and inventive nozzle structure for generating colliding streams is illustrated in FIGS. 5*a*, 5*b*, and 5*c* and is described below. Another particularly preferred and inventive nozzle structure is illustrated in FIG. 7 and is described below.

Choosing appropriate velocities for each of streams 22 and 20 requires a balancing of competing concerns. For example, if the velocity of fluid stream 20 is too low at the time of collision, stream 20 may not have enough momentum to reach collision point 26. On the other hand, too high a velocity may make it difficult to eject fluid stream 20 from a nozzle under laminar flow conditions. If the velocity of carrier gas stream 22 were too low, the average size of droplets 28 may be too large to be vaporized efficiently or to form coating 12 of the desired uniformity. On the other hand, the velocity of carrier gas stream 22 may be as high as is desired. Indeed, higher gas velocities are better for atomizing and vaporizing more viscous/continuity liquid compositions. However, above a certain range of gas velocities, coating may be adversely affected due to substrate flutter and condensing inefficiencies. Balancing these concerns, stream 20 preferably has a velocity of 0.1 meters per second (m/s) to 30 m/s, more preferably 1 m/s to 20 m/s, most preferably about 10 m/s, and carrier gas stream 22 preferably has a velocity of 40 to 350 m/s, more preferably about 60 to 300 m/s, most preferably about 180 to 200 m/s.

Referring again to FIG. 1*a*, system 10 is very versatile and can be used to form coatings from an extremely broad range of fluid compositions 18. Fluid compositions may be used that are effective for forming adhesive coatings, primer coatings, decorative coatings, protective hard coatings, varnish coatings, antireflective coatings, reflective coatings, interference coatings, release coatings, dielectric coatings, photoresist coatings, conductive coatings, nonlinear optic coatings, electrochromic/electroluminescent coatings, barrier coatings, biologically-active coatings, biologically inert coatings, and the like.

Preferably, fluid composition 18 comprises at least one fluid component having a vapor pressure sufficiently high to be vaporized as a result of contact with carrier gas 24 at temperatures below the boiling point of the component. More preferably, all fluid components of fluid composition 18 have such a vapor pressure. Generally, a fluid component has a sufficiently high vapor pressure for this purpose if substantially all of the fluid component can vaporize into admixture with carrier gas 24 and yet still have a resultant partial pressure in the resultant gaseous admixture that is below the saturation vapor pressure for that component. In typical coating operations, preferred fluid components have a vapor pressure in the range of 0.13 mPa to 13 kPa ($1\times10^{-6}$ Torr to 100 Torr) at standard temperature and pressure.

So long as the fluid components have the requisite vapor pressure, such components may be organic, inorganic, aqueous, nonaqueous, or the like. In terms of phase characteristics, fluid composition 18 may be homogeneous or a multiphase mixture of components and may be in the form of a solution, a slurry, a multiphase fluid composition, or the like. To form polymeric coatings, fluid composition 18 may include one or more components that are monomeric, oligomeric, or polymeric, although typically only relatively low molecular weight polymers, e.g., polymers having a number average molecular weight of less than 10,000, preferably less than about 7500, and more preferably less than about 4500, would have sufficient vapor pressure to be vaporized in the practice of the present invention. As used herein, the term "monomer" refers to a single, one unit molecule capable of combination with itself or other monomers to form oligomers or polymers. The term "oligomer" refers to a compound that is a combination of 2 to 10 monomers. The term "polymer" refers to a compound that is a combination of 11 or more monomers.

Representative examples of the at least one fluid component would include chemical species such as water; organic solvents, inorganic liquids, radiation curable monomers and oligomers having carbon-carbon double bond functionality (of which alkenes, (meth)acrylates, (meth)acrylamides, styrenes, and allylether materials are representative), fluoropolyether monomers, oligomers, and polymers, fluorinated (meth)acrylates, waxes, silicones, silane coupling agents, disilazanes, alcohols, epoxies, isocyanates, carboxylic acids, carboxylic acid derivatives, esters of carboxylic acid and an alcohol, anhydrides of carboxylic acids, aromatic compounds, aromatic halides, phenols, phenyl ethers, quinones, polycyclic aromatic compounds, nonaromatic heterocycles, azlactones, furan, pyrrole, thiophene, azoles, pyridine, aniline, quinoline, isoquinoline, diazines, pyrones, pyrylium salts, terpenes, steroids, alkaloids, amines, carbamates, ureas, azides, diazo compounds, diazonium salts, thiols, sulfides, sulfate esters, anhydrides, alkanes, alkyl halides, ethers, alkenes, alkynes, aldehydes, ketones, organometallic species, titanates zirconates, aluminates, sulfonic acids, phosphines, phosphonium salts, phosphates, phosphonate esters, sulfur-stabilized carbanions, phosphorous stabilized carbanions, carbohydrates, amino acids, peptides, reaction products derived from these materials that are fluids having the requisite vapor pressure or can be converted (e.g., melted, dissolved, or the like) into a fluid having the requisite vapor pressure, combinations of these, and the like. Of these materials, any that are solids under ambient conditions, such as a paraffin wax, can be melted, or dissolved in another fluid component, in order to be processed using the principles of the present invention.

In some embodiments of the invention, the fluid component(s) to be included in fluid composition 18 is/are capable of forming a solid coating upon substrate 16 due in substantial part to a phase change resulting from cooling such component(s). For example, a wax vapor typically will condense onto substrate surface 14 as a liquid, but then will solidify as the temperature of the coating is cooled to a temperature below the melting point of the wax. Examples of other useful coating materials that have this phase change behavior include polycyclic aromatic compounds such as naphthalene and anthracene.

In other embodiments of the invention, fluid composition 18 may comprise one or more different fluid components that are capable of reacting with each other to form a coating that is a reaction product derived from reactants comprising such components. These components may be monomeric, oligomeric, and/or low molecular weight polymers (collectively referred to herein as "polymeric precursors") so that the reaction between the components yields a polymeric coating. For example, fluid composition 18 may include a polyol component such as a diol and/or a triol, a polyisocyanate such as a diisocyanate and/or a triisocyanate, and optionally a suitable catalyst (or, alternatively, substrate surface 14 can be pre-treated with the catalyst so that the reactive components do not react until contacting substrate surface 14). Upon coating, the components could then react with each other to form a polyurethane coating on substrate 16.

As another example of an approach using polymeric precursors, fluid composition 18 may comprise one or more organofunctional silane or titanate monomers. Such organofunctional silane and titanate monomers generally are capable of crosslinking upon drying and heating to form a polymeric siloxane-type or titanate-type matrix. A wide variety of organofunctional silane or titanate monomers may be used in the practice of the present invention. Representative examples include methyl trimethoxysilane, methyl triethoxysilane, phenyl trimethoxysilane, phenyl triethoxysilane, (meth)acryloxyalkyl trimethoxysilane, isocyanatopropyltriethoxysilane, mercaptopropyltriethoxysilane, (meth)acryloxyalkyl trichlorosilane, phenyl trichlorosilane, vinyl trimethoxysilane, vinyl triethoxysilane, propyl trimethoxysilane, propyl triethoxysilane, glycidoxyalkyl trimethoxysilane, glycidoxyalkyl triethoxysilane, glycidoxyalkyl trichlorosilane, perfluoro alkyl trialkoxysilane, perfluoromethyl alkyl trialkoxysilane, perfluoroalkyl trichlorosilane, perfluorooctylsulfonamidopropylmethoxysilane, titanium isopropoxide, isopropyldimethacryl-isostearoyltitanate, isopropyl tri(N-ethylenediamine)ethyltitanate, combinations of these, and the like.

In still other embodiments of the present invention, fluid composition 18 may comprise at least one polymeric precursor component capable of forming a curable liquid coating upon substrate 16, wherein the component(s) comprise radiation crosslinkable functionality such that the liquid coating is curable upon exposure to radiant curing energy in order to cure and solidify (i.e. polymerize and/or crosslink) the coating. Representative examples of radiant curing energy include electromagnetic energy (e.g., infrared energy, microwave energy, visible light, ultraviolet light, and the like), accelerated particles (e.g., electron beam energy), and/or energy from electrical discharges (e.g., coronas, plasmas, glow discharge, or silent discharge).

In the practice of the present invention, radiation crosslinkable functionality refers to functional groups directly or indirectly pendant from a monomer, oligomer, or polymer backbone (as the case may be) that participate in crosslinking and/or polymerization reactions upon exposure to a suitable source of radiant curing energy. Such functionality generally includes not only groups that crosslink via a cationic mechanism upon radiation exposure but also groups that crosslink via a free radical mechanism. Representative examples of radiation crosslinkable groups suitable in the practice of the present invention include epoxy groups, (meth)acrylate groups, olefinic carbon-carbon double bonds, allylether groups, styrene groups, (meth)acrylamide groups, combinations of these, and the like.

Preferred free-radically curable monomers, oligomers, and/or polymers each include one or more free-radically polymerizable, carbon-carbon double bonds such that the average functionality of such materials is at least one free-radically carbon-carbon double bond per molecule. Materials having such moieties are capable of copolymerization and/or crosslinking with each other via such carbon-carbon double bond functionality. Free-radically curable monomers suitable in the practice of the present invention are preferably selected from one or more mono, di, tri, and tetrafunctional, free-radically curable monomers. Various amounts of the mono, di, tri, and tetrafunctional, free-radically curable monomers may be incorporated into the present invention, depending upon the desired properties of the final coating. For example, in order to provide coatings with higher levels of abrasion and impact resistance, it is desirable for the composition to include one or more multifunctional free-radically curable monomers, preferably at least both di and tri functional free-radically curable monomers, such that the free-radically curable monomers incorporated into the composition have an average free-radically curable functionality per molecule of greater than 1.

Preferred compositions of the present invention may include 1 to 100 parts by weight of monofunctional free-radically curable monomers, 0 to 75 parts by weight of difunctional free-radically curable monomers, 0 to 75 parts by weight of trifunctional free-radically curable monomers, and 0 to 75 parts by weight of tetrafunctional free-radically curable monomers, subject to the proviso that the free-radically curable monomers have an average functionality of 1 or greater, preferably 1.1 to 4, more preferably 1.5 to 3.

One representative class of monofunctional free-radically curable monomers suitable in the practice of the present invention includes compounds in which a carbon-carbon double bond is directly or indirectly linked to an aromatic ring. Examples of such compounds include styrene, alkylated styrene, alkoxy styrene, halogenated styrenes, free-radically curable naphthalene, vinylnaphthalene, alkylated vinyl naphthalene, alkoxy vinyl naphthalene, combinations of these, and the like. Another representative class of monofunctional, free radially curable monomers includes compounds in which a carbon-carbon double bond is attached to an cycloaliphatic, heterocyclic, and/or aliphatic moiety such as 5-vinyl-2-norbornene, 4-vinyl pyridine, 2-vinyl pyridine, 1-vinyl-2-pyrrolidinone, 1-vinyl caprolactam, 1-vinylimidazole, N-vinyl formamide, and the like.

Another representative class of such monofunctional free-radically curable monomers include (meth)acrylate functional monomers that incorporate moieties of the formula:

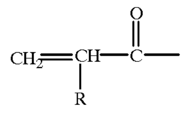

wherein R is a monovalent moiety, such as hydrogen, halogen, methyl, or the like. Representative examples of monomers incorporating such moieties include (meth) acrylamides, chloro(meth)acrylamide, linear, branched, or cycloaliphatic esters of (meth)acrylic acid containing from 1 to 10, preferably 1–8, carbon atoms, such as methyl (meth) acrylate, n-butyl (meth)acrylate, t-butyl (meth)acrylate, ethyl (meth)acrylate, isopropyl (meth)acrylate, 2-ethylhexyl (meth)acrylate, and isooctylacrylate; vinyl esters of alkanoic acids wherein the alkyl moiety of the alkanoic acids contain 2 to 10, preferably 2 to 4, carbon atoms and may be linear, branched, or cyclic; isobornyl (meth)acrylate; vinyl acetate; allyl (meth)acrylate, and the like.

Such (meth)acrylate functional monomers may also include other kinds of functionality such as hydroxyl functionality, nitrile functionality, epoxy functionality, carboxylic functionality, thiol functionality, amine functionality, isocyanate functionality, sulfonyl functionality, perfluoro functionality, sulfonamido, phenyl functionality, combinations of these, and the like. Representative examples of such free-radically curable compounds include glycidyl (meth)acrylate, (meth)acrylonitrile, β-cyanoethyl-(meth)acrylate, 2-cyanoethoxyethyl (meth) acrylate, p-cyanostyrene, p-(cyanomethyl)styrene, an ester of an ,β-unsaturated carboxylic acid with a diol, e.g., 2-hydroxyethyl (meth)acrylate, or 2-hydroxypropyl (meth) acrylate; 1,3-dihydroxypropyl-2-(meth)acrylate; 2,3-dihydroxypropyl-1-(meth)acrylate; an adduct of an ,β-unsaturated carboxylic acid with caprolactone; an alkanol vinyl ether such as 2-hydroxyethyl vinyl ether; 4-vinylbenzyl alcohol; allyl alcohol; p-methylol styrene, N,N-dimethylamino (meth)acrylate, (meth)acrylic acid, maleic acid, maleic anhydride, trifluoroethyl (meth)acrylate, tetrafluoropropyl (meth)acrylate, hexafluorobutyl (meth) acrylate, butylperfluorooctylsulfonamidoethyl (meth) acrylate, ethylperfluorooctylsulfonamidoethyl (meth) acrylate, mixtures thereof, and the like.

Another class of monofunctional free-radically curable monomers suitable in the practice of the present invention includes one or more N,N-disubstituted (meth)acrylamides. Use of an N,N-disubstituted (meth)acrylamide provides numerous advantages. For example, the use of this kind of monomer provides antistatic coatings which show improved adhesion to polycarbonate substrates. Further, use of this kind of monomer also provides coatings with improved weatherability and toughness. Preferably, the N,N-disubstituted (meth)acrylamide has a molecular weight in the range from 99 to about 500, preferably from about 99 to about 200.

The N,N-disubstituted (meth)acrylamide monomers generally have the formula:

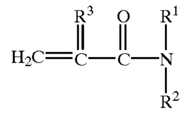

wherein $R^1$ and $R^2$ are each independently hydrogen, a $(C_1–C_8)$alkyl group (linear, branched, or cyclic) optionally having hydroxy, halide, carbonyl, and amido functionalities, a $(C_1–C_8)$alkylene group optionally having carbonyl and amido functionalities, a $(C_1–C_4)$alkoxymethyl group, a $(C_4–C_{10})$aryl group, a $(C_1–C_3)$alk$(C_4–C_{10})$aryl group, or a $(C_4–C_{10})$heteroaryl group; with the proviso that only one of $R^1$ and $R^2$ is hydrogen; and $R^3$ is hydrogen, a halogen, or a methyl group. Preferably, $R^1$ is a $(C_1–C_4)$alkyl group; $R^2$ is a $(C_1–C_4)$alkyl group; and $R^3$ is hydrogen, or a methyl group. $R^1$ and $R^2$ can be the same or different. More preferably, each of $R^1$ and $R^2$ is $CH_3$, and $R^3$ is hydrogen.

Examples of such suitable (meth)acrylamides are N-tert-butylacrylamide, N,N-dimethylacrylamide, N,N-diethylacrylamide, N-(5,5-dimethylhexyl)acrylamide, N-(1,1-dimethyl-3-oxobutyl)acrylamide, N-(hydroxymethyl) acrylamide, N-(isobutoxymethyl)acrylamide, N-isopropylacrylamide, N-methylacrylamide, N-ethylacrylamide, N-methyl-N-ethylacrylamide, and N,N'-methylene-bis acrylamide. A particularly preferred (meth) acrylamide is N,N-dimethyl (meth)acrylamide.

Other examples of free-radically curable monomers include alkenes such as ethene, 1-propene, 1-butene, 2-butene (cis or trans) compounds including an allyloxy moiety, and the like.

In addition to, or as an alternative to, the monofunctional free-radically curable monomer, any kind of multifunctional free-radically curable monomers preferably having di, tri, and/or tetra free-radically curable functionality also can be used in the present invention. Such multifunctional (meth) acrylate compounds are commercially available from a number of different suppliers. Alternatively, such compounds can be prepared using a variety of well known reaction schemes. For example, according to one approach, a (meth)acrylic acid or acyl halide or the like is reacted with a polyol having at least two, preferably 2 to 4, hydroxyl groups. This approach can be represented by the following schematic reaction scheme which, for purposes of illustration, shows the reaction between acrylic acid and a triol:

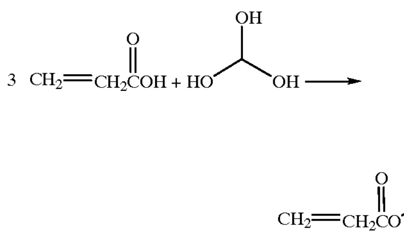

This reaction scheme as illustrated provides a trifunctional acrylate. To obtain di or tetra functional compounds, corresponding diols and tetrols could be used in place of the triol, respectively.

According to another approach, a hydroxy or amine functional (meth)acrylate compound or the like is reacted with a polyisocyanate, or isocyanurate, or the like having 2 to 4 NCO groups or the equivalent. This approach can be represented by the following schematic reaction scheme which, for purposes of illustration, shows the reaction between hydroxyethyl acrylate and a diisocynate:

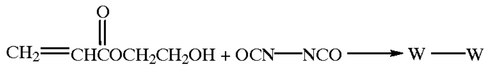

wherein each W is

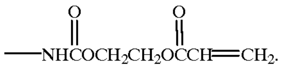

This reaction scheme as illustrated provides a difunctional (meth)acrylate. To obtain tri or tetra functional compounds, corresponding tri or tetra functional isocyanates could be used in place of the diisocyanate, respectively.

Another preferred class of multifunctional (meth)acryl functional compounds includes one or more multifunctional, ethylenically unsaturated esters of (meth)acrylic acid and may be represented by the following formula:

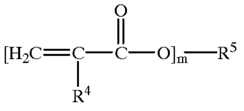

wherein $R^4$ is hydrogen, halogen or a $(C_1–C_4)$alkyl group; $R^5$ is a polyvalent organic group having m valencies and can be cyclic, branched, or linear, aliphatic, aromatic, or heterocyclic, having carbon, hydrogen, nitrogen, nonperoxidic oxygen, sulfur, or phosphorus atoms; and m is an integer designating the number of acrylic or methacrylic groups in the ester and has a value of 2 to 4. Preferably, $R^4$ is hydrogen, methyl, or ethyl, $R^5$ has a molecular weight of about 14–100, and m has a value of 2–4. Where a mixture of multifunctional acrylates and/or methacrylates are used, m preferably has an average value of about 1.05 to 3.

Specific examples of suitable multifunctional ethylenically unsaturated esters of (meth)acrylic acid are the polyacrylic acid or polymethacrylic acid esters of polyhydric alcohols including, for example, the diacrylic acid and dimethylacrylic acid ester of aliphatic diols such as ethyleneglycol, triethyleneglycol, 2,2-dimethyl-1,3-propanediol, 1,3-cyclopentanediol, 1-ethoxy-2,3-propanediol, 2-methyl-2,4-pentanediol, 1,4-cyclohexanediol, 1,6-hexanediol, 1,2-cyclohexanediol, 1,6-cyclohexanedimethanol; hexafluorodecanediol, octafluorohexanediol, perfluoropolyetherdiol, the triacrylic acid and trimethacrylic acid esters of aliphatic triols such as glycerin, 1,2,3-propanetrimethanol, 1,2,4-butanetriol, 1,2,5-pentanetriol, 1,3,6-hexanetriol, and 1,5,10-decanetriol; the triacrylic acid and trimethacrylic acid esters of tris (hydroxyethyl)isocyanurate; the tetraacrylic and tetramethacrylic acid esters of aliphatic triols, such as 1,2,3,4-butanetetrol, 1,1,2,2,-tetramethylolethane, and 1,1,3,3-tetramethylolpropane; the diacrylic acid and dimethacrylic acid esters of aromatic diols such as pyrocatechol, and bisphenol A; mixtures thereof; and the like.

Still referring to FIG. 1*a*, carrier gas 24 may be any gas or combination of gases that may be inert or reactive with respect to all or a portion of fluid composition 18, as desired. However, in many applications it is preferred that carrier gas 24 is inert with respect to all components of fluid composition 18. In particular, when fluid composition 18 includes an organic liquid, it is preferable that carrier gas 24 does not include an oxidizing gas such as oxygen. Representative examples of inert gases include nitrogen, helium, argon, carbon dioxide, combinations of these, and the like. For fluid compositions 18 in which oxidation is not a concern, ordinary ambient air could be used as carrier gas 24 if desired.

Following atomization, liquid droplets 28 vaporize and become dispersed in carrier gas 24 as a non-light-scattering vapor phase schematically depicted as vapor 30. Vapor 30 preferably is a true vapor, but also might be a dispersed phase in which dispersed droplets are too small, e.g., being of an average size of less than about 30 nm, to scatter visible and/or laser light having a wavelength of 630 nm to 670 nm. Thus, although FIG. 1*a* shows vapor 30 schematically as a plurality of droplets, in actuality, vapor 30 is not visible.

In fact, the visual disappearance of liquid droplets 28 over the distance d following the collision of streams 22 and 20 indicates that collision was carried out under conditions effective to vaporize substantially all of fluid composition 18. The actual distance d over which vaporization of the atomized droplets 28 is completed will vary depending upon a variety of factors, including the nature of fluid composition 18 and carrier gas 24, the respective temperatures of fluid composition 18 and the carrier gas 24, the velocities of streams 22 and 20 at the time of collision, the temperature of chamber 17 within which atomization and vaporization occur, and the like. Typically, d is in the range from 2 cm to 20 cm for the scale of equipment described in the examples below. Accordingly, chamber 17, when present, will typically have a length at least as long as d in order to be able to handle a wide range of coating materials.

Figure 3:
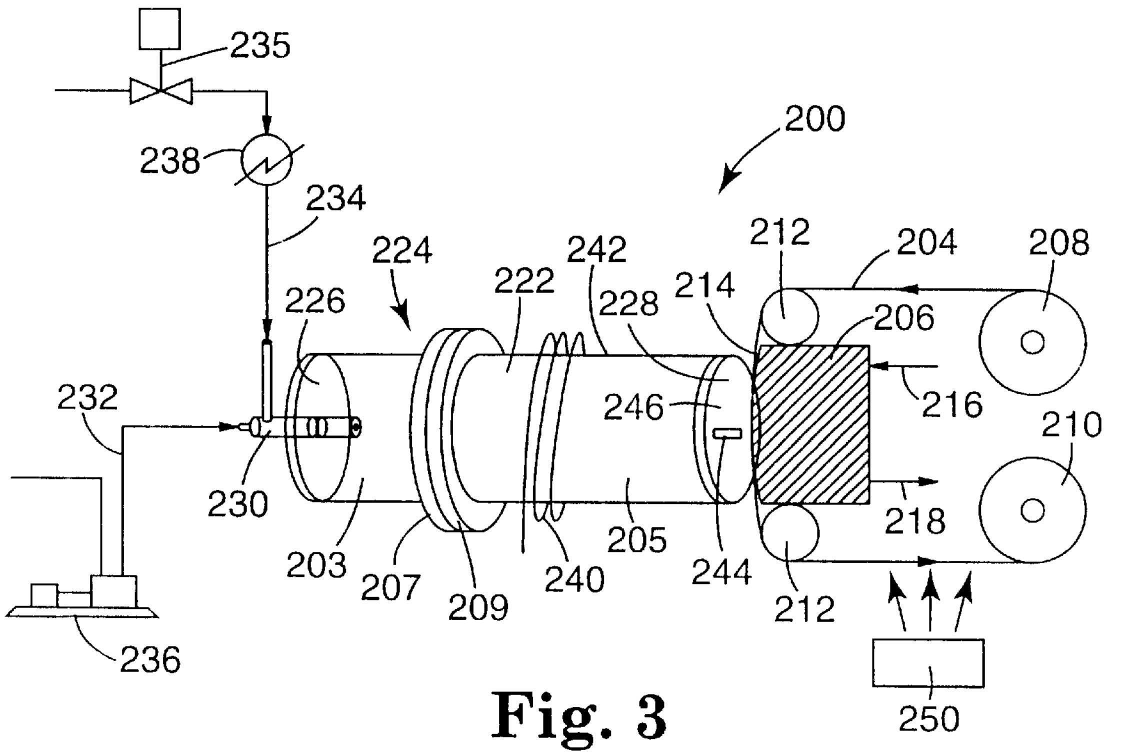
FIG. 3 is a schematic representation of another coating system embodiment of the present invention.
Figure 4:
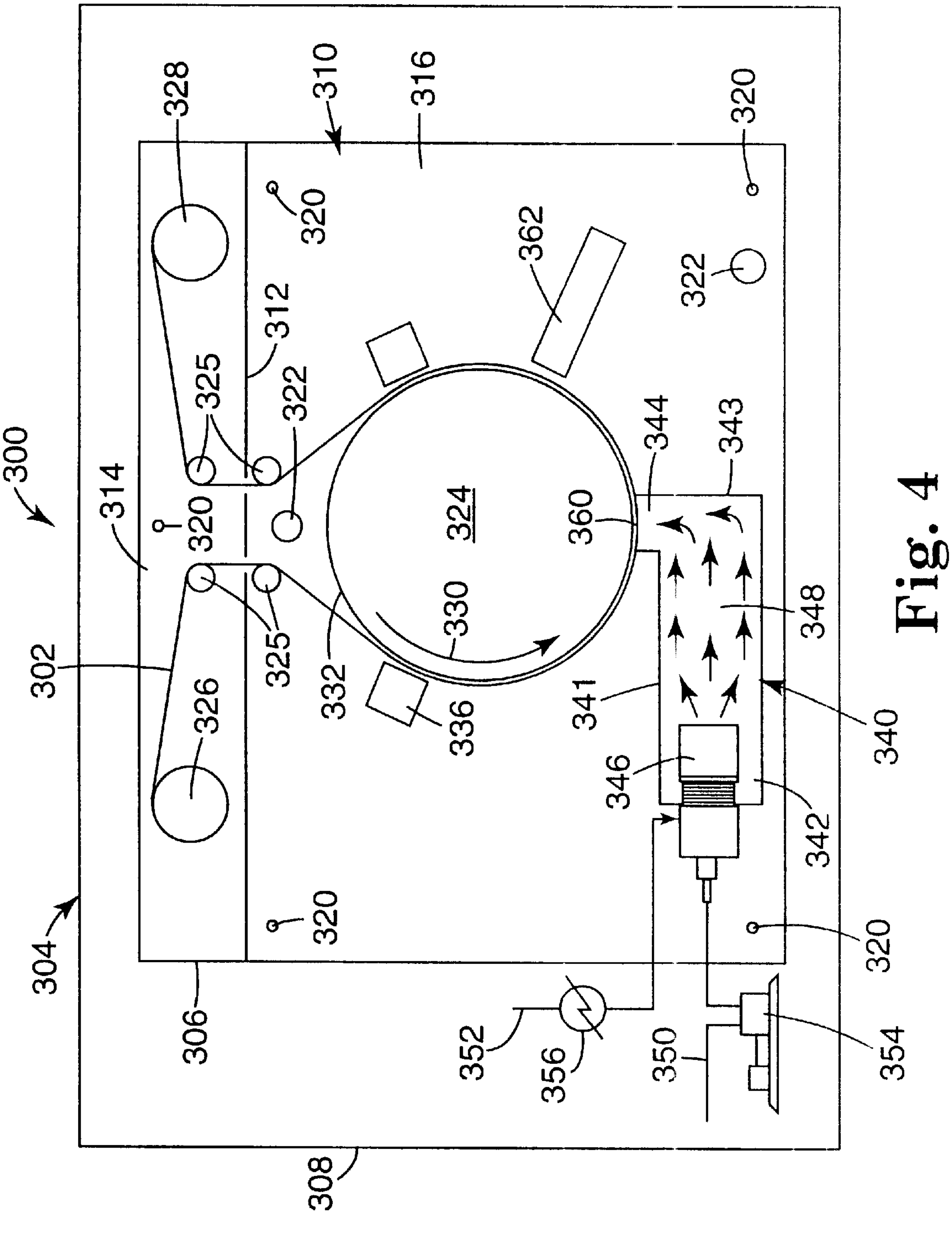
FIG. 4 is a schematic representation of a coating system embodiment of the present invention suitable for forming radiation cured coatings on a flexible substrate.

Chamber 17 is not necessary, but helps convey vapor to substrate 16 more efficiently and also helps shape the geometry of the vapor 30 to enhance coating performance. When used, chamber 17 could be linear along a length extending from the region of atomization to the region at which vapor 30 contacts substrate 16, but this is not required. Indeed, even if chamber 17 were to comprise a plurality of twists and turns, vapor 30 would still tend to flow toward substrate 16. For example, although FIG. 3 shows vapor transport tubes with linear chambers, FIG. 4 illustrates a chamber with a 90° turn.

So long as enough carrier gas 24 is used at a temperature above the condensation point of vapor 30, which typically is a temperature well below the boiling point of the fluid components that are vaporized, vapor 30 can exist in admixture with carrier gas 24 as a true vapor phase. Higher temperatures, e.g., temperatures at or above the boiling point of the fluid components, are not needed to achieve and maintain vaporization because contact between carrier gas 24 and fluid composition is carried out under conditions such that the partial pressure of vapor 30 is below the vapor saturation pressure. This ability to vaporize components without resorting to higher temperatures is particularly advantageous when using a fluid composition 18 in which one or more of the components might be damaged or otherwise degraded at high temperatures.

If the components of fluid composition 18 would not be harmed by high temperatures, carrier gas 24 could be supplied at temperatures above the boiling point(s) of the fluid component(s). In fact, the use of such higher temperatures may be beneficial in some applications. For example, because the thermal energy for vaporization comes from carrier gas 24, higher gas temperatures may be needed and/or desirable in order to supply enough thermal energy to vaporize some liquids, particularly at higher flow rates of the liquids. In such instances, the resultant admixture of carrier gas 24 and vapor 30 may have a temperature above or below the boiling point(s) of one or more of the vapor components, depending upon factors such as the initial temperature of the carrier gas 24, the initial temperature of fluid composition 18, and the relative flow rates of the two materials.

Thus, vapor 30 will have a condensation temperature above which all of vapor 30 would tend to remain in the vapor phase. On the other hand, below the condensation temperature, vapor 30 would tend to condense into a liquid phase. Accordingly, stream 22 of carrier gas 24 preferably is supplied to chamber 17 at a temperature above the condensation point of vapor 30. Preferably, carrier gas 24 is heated to an elevated temperature that is above the condensation point, but nonetheless is still less than the boiling point of at least one component of fluid composition, and more preferably is less than the boiling point of any fluid component of fluid composition 18.

From this discussion, it can be appreciated that if the admixture of carrier gas 24 and vapor 30 were to fall to a temperature below the condensation temperature of vapor 30 before vapor 30 were to reach substrate surface 14, at least portions of vapor 30 could condense prematurely. In order to prevent this, chamber 17 is preferably heatable to maintain the gaseous admixture at a temperature above the vapor condensation temperature. Heat can be added to chamber 17 in any desired manner. For example, the contents of chamber 17 could be irradiated with infrared, microwave, RF energy, or laser energy. As another example, walls 19 of chamber 17 could be heated by an electric heating coil or a heating jacket that circulates a hot gas or liquid, e.g., steam, around or in walls 19.

The admixture of carrier gas 24 and vapor 30 flow to the surface 14 of substrate 16, which is cooled to a temperature below the condensation temperature of vapor 30. As a result, vapor 30 condenses on surface 14 and forms thin, substantially uniform coating 12. Substrate 16 may be cooled using any convenient cooling means. As shown, substrate 16 is cooled by being placed in thermal contact with a chilled support member 32. Use of support member 32 is particularly advantageous in that cooling effects are thermally transferred primarily to substrate 16 rather than to other parts of system 10 such as the admixture of carrier gas 24 and vapor 30. In this way, the amount of vapor 30 that condenses before reaching substrate 16 is minimized. Support member 32 may be chilled using any desired chilling technique. As shown, support member 32 is chilled by circulating a suitable cooling medium, such as chilled water or the like, through support member 32 from cooling medium supply line 34. The cooling medium is withdrawn from support member 32 through drain line 36.

Substrates suitable for coating by the present invention can be made from many different materials and have many different shapes. For example, in terms of materials, substrates can be metal, wood, cloth, polymeric, ceramic, paper, mineral, glass, composite, and the like. In terms of shapes, substrates can be flat, curved, undulating, twisted, microstructured, smooth, rough, porous, particulate, fibrous, hollow shaped, three-dimensional, regular or irregular surfaced, and the like. Methods of placing the substrates proximate to the vapor stream of the invention depend on the coating and substrate desired. Suitable methods include, for example, transport techniques for flexible web-like substrates and fibers, vibratory or suspension techniques for particulate substrates, and movable vapor source or substrate for three-dimensional substrates.

In the embodiment shown in FIG. 1*a*, substrate 16 and support member 32 do not move during coating. Thus, the embodiment shown in FIG. 1*a* would be suitable for carrying out batchwise coating operations. However, as an option, coating operations may be carried out in a steady state fashion. For example, FIGS. 3 and 4 show embodiments of the present invention in which long lengths of a moving substrate are coated in steady state coating operations.

Advantageously, the present invention can be used to form coatings such as coating 12 having a wide range of thicknesses. In preferred embodiments, coatings having uniform thicknesses ranging from 0.01 micrometers to 5 micrometers are easily formed in a single pass. Thicker films, or multilayer films of differing materials, can be formed by coating substrate 16 in multiple coating passes or through multiple depositions in a single pass. Advantageously, the present invention also allows coatings to be formed that are substantially pin-hole free. It is also believed that the coatings would demonstrate an absence of phase separation when co-condensing separate vapors and/or vapor blends.

After coating 12 is initially formed as a result of condensation of vapor 30 onto surface 14, coating 12 may optionally be subjected to further optional processing depending upon the characteristics desired for coating 12. For instance, if coating 12 is formed from constituents that can cure or crosslink and solidify upon exposure to radiant curing energy, coating 12 may be irradiated with a suitable dosage of radiant curing energy in order to cure the coating. If coating is formed from constituents that thermally cure and solidify upon heating, coating 12 may be heated under suitable conditions effective to achieve such curing. If coating 12 is formed from constituents that solidify due to a phase change upon further cooling, coating 12 may be cooled to a temperature at which the constituents solidify. Excess carrier gas 24 and vapor 30, collectively depicted in FIG. 1A as exhaust gas 39, may be exhausted from chamber 17 through exhaust port 38.

Figure 1B:
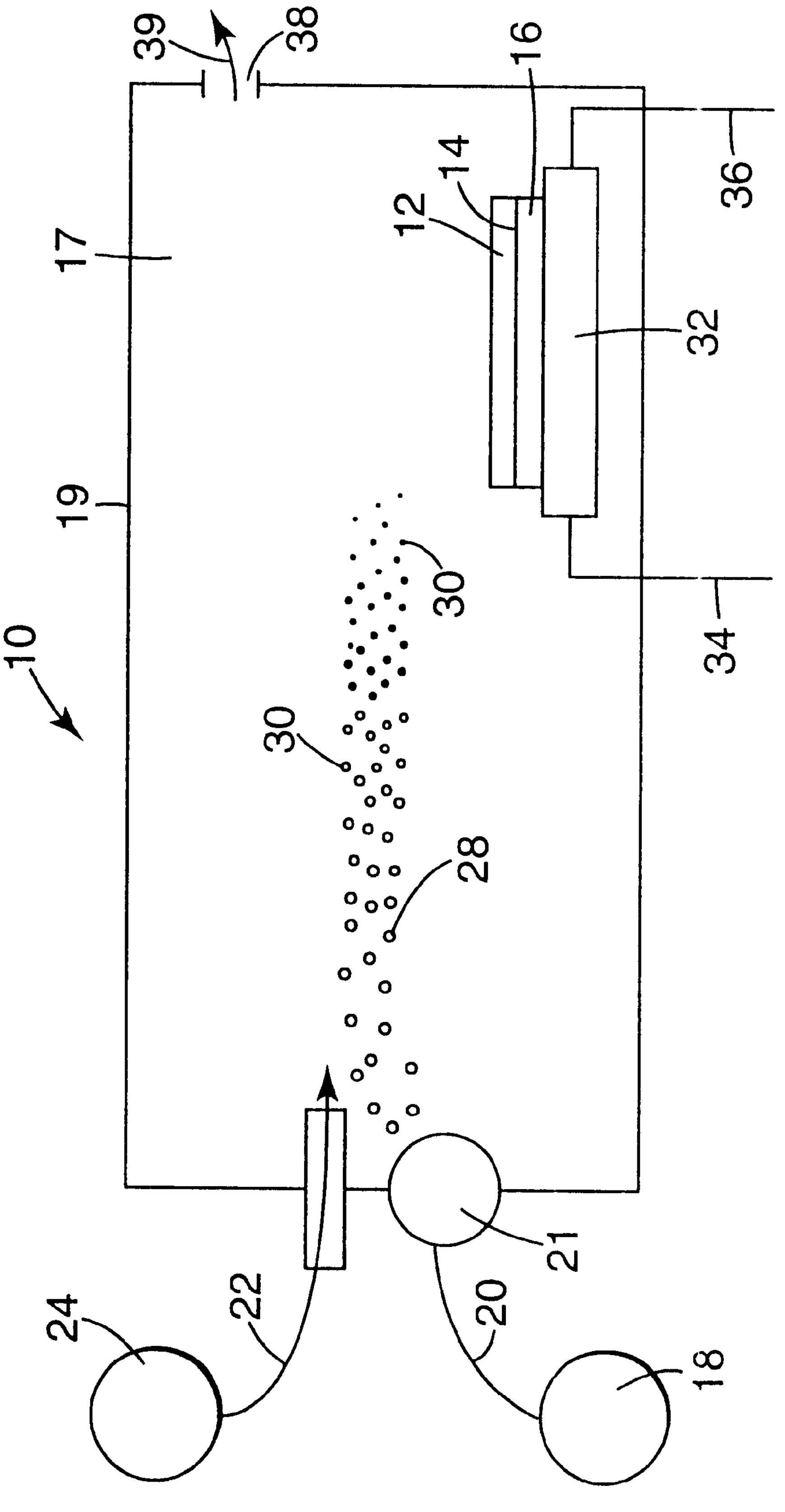
FIG. 1*b* is schematic representation of a coating system of the present invention using alternative means to achieve atomization.

In FIG. 1*a*, atomization is achieved by colliding stream 22 with 20, wherein the energy of the collisions breaks up fluid composition 18 into the mist of fine liquid droplets 28. Collision atomization under laminar flow conditions is advantageous because fluid composition 18 can be atomized smoothly with no pulses that could result in variations in the volumeric concentration of the droplets and subsequent vapor over time. Atomization could also be accomplished by other means, although other atomization means tend to develop pulsed characteristics in the atomization. For example, fluid composition 18 could be atomized using conventional atomizing means that ejects or otherwise sprays atomized liquid droplets 28 into carrier gas 24, so that the droplets 28 can vaporize. Such other atomization approaches include ultrasonic atomization, spinning disk atomization, and the like. FIG. 1*b* shows this schematically. FIG. 1*b* is generally similar to FIG. 1*a* except that fluid stream 20 is atomized using atomizer component 21 instead of stream collision. A wide variety of representative atomizing structures suitable for use as atomizer component 21 are described in Lefebvre, A. H., *Atomization and Sprays*, Hemisphere Publishing Corp., U.S.A. (1989); Harari et al., *Atomization and Sprays*, vol. 7, pp. 97–113 (1997).

As another alternative, fluid stream 20 and gas stream 22 may be pre-mixed first, after which fluid composition 18 is atomized using conventional atomizing means. In this way, the resultant atomized droplets 28 would be in intimate admixture with carrier gas 24 at the time of atomization. Advantageously, pre-mixing fluid stream 20 and carrier gas stream 24 uses less carrier gas 24 then does the colliding approach of FIG. 1*a*. However, droplets 28 formed by collision tend to be smaller and vaporize faster than droplets 28 formed using the pre-mixing approach. As another alternative, atomization can be carried out by colliding two or more streams of fluid composition 18 in a manner such that the resultant atomized droplets 28 can be contacted with carrier gas 24.

Figure 2A:
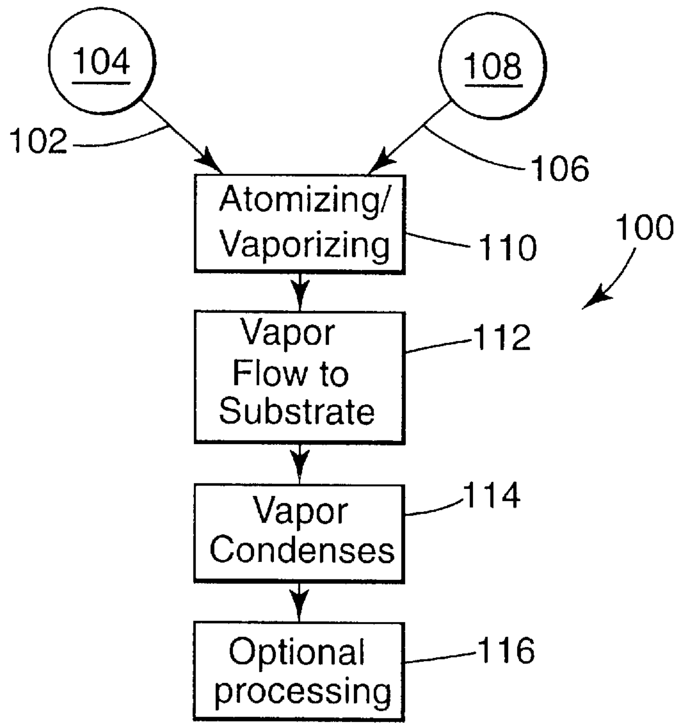
FIG. 2*a* is a flow chart representation of the coating system of FIGS. 1*a* and 1*b;*

FIG. 2*a* is a flow chart diagram outlining one preferred mode of operation 100 of system 10 of FIG. 1*a*. Consideration of mode of operation 100 in flow chart form in this manner is particularly helpful in appreciating alternative mode of operation 100' of the present invention shown in flow chart form in FIG. 2*b*. Referring first to FIG. 2*a*, stream 102 of fluid composition 104 and stream 106 of carrier gas 108 are joined in step 110 under conditions effective to atomize and vaporize fluid composition 104 to form a gaseous admixture comprising carrier gas 108 and the vaporized fluid composition. In step 112, the vapor flows to the surface of a cooled substrate, where the vapor condenses as a liquid and forms a coating on the substrate in step 114. In step 116, the coating is subjected to optional post-condensation processing.

Mode of operation 100 can be easily adapted to handle fluid compositions 104 derived from and/or including one or more components that are normally solid under ambient conditions. For example, a material that melts easily to form a vaporizable fluid, e.g., a wax, can be melted and then incorporated into fluid composition 104 in melted form. Other solids may have solubility characteristics allowing them to readily dissolve when combined with another fluid component of fluid composition 104. As an example, many solid photoinitiators are soluble in fluids comprising radiation curable monomers whose polymerization is beneficially facilitated by the presence of a photoinitiator. Other solid materials may be supplied as fine particles that either melt when contacting carrier 108 or are small enough to be transported to the coating site along with the coating vapor.

Figure 2B:
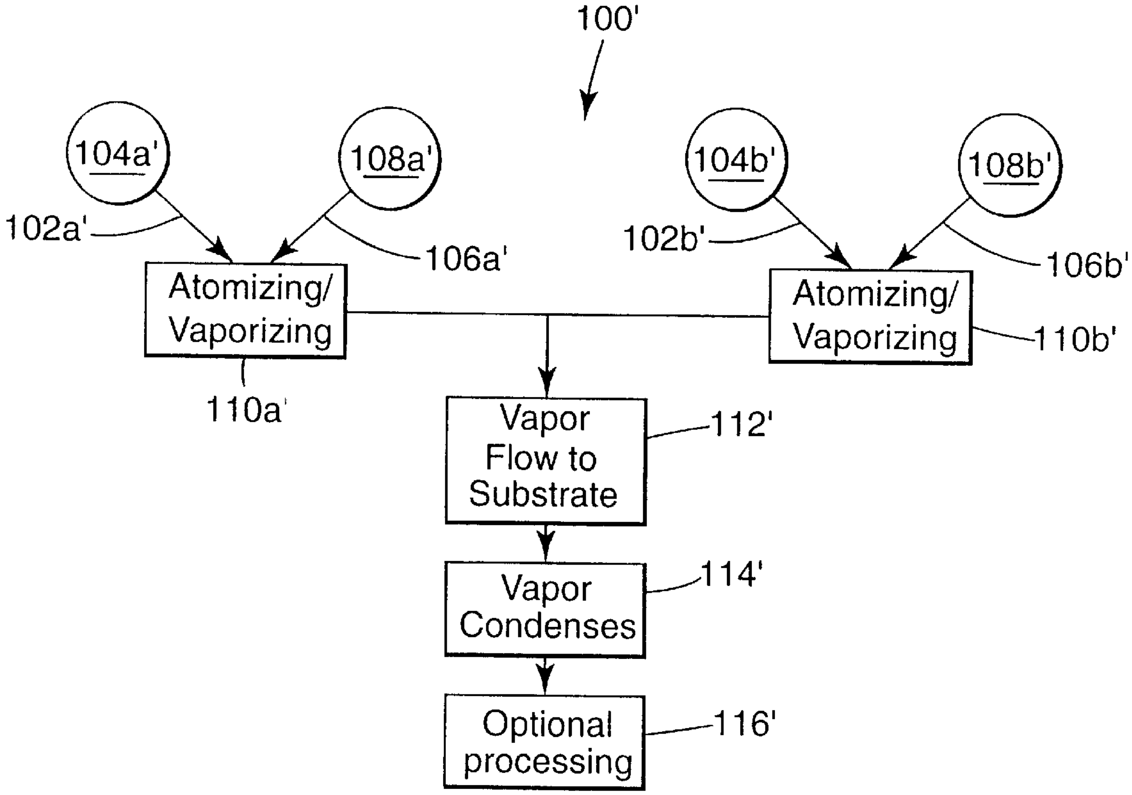
FIG. 2*b* is a flow chart representation of an alternative coating system of the present invention when using multiple coating materials that are blended as vapors prior to coating.

FIG. 2*b* shows an alternative mode of operation 100' which is generally identical to mode of operation 100 of FIG. 2*a*, except that mode of operation 100' is capable of joining a plurality of fluid streams 102*a*', 102*b*', etc. with a corresponding plurality of carrier gas streams 106*a*', 106*b*', etc., in a manner effective to atomize and vaporize fluid streams 102*a*', 102*b*', etc. Such vapor formation may occur substantially simultaneously in the same chamber to form blended vapors. Simultaneous vapor formation is particularly preferred for forming homogeneous coatings from fluids that are normally immiscible with each other. Alternatively, the vapor formation may occur sequentially in the same chamber so that multilayered coatings can be formed. Alternatively, such vapor formation may occur in separate chambers, after which the vapors are sprayed simultaneously from the separate chambers onto a substrate. Spraying of vapors simultaneously from separate chambers is preferred for forming coatings from vapors that are reactive with each other.

FIG. 3 shows one specific embodiment of an apparatus 200 of the present invention useful for forming a coating (not shown for purposes of clarity) on a flexible web 204 that moves across chilled support member 206 from supply roll 208 to take-up roll 210. Generally, coating operations may be carried out while transporting flexible web 204 at any desired speed within a wide speed range. For example, flexible web 204 may be transported at a speed in the range from about 1 cm/s to 1000 cm/s. Flexible web 204 may be formed from a variety of flexible materials including polymers, paper, fibrous material and cloth formed from natural and/or synthetic fibers, metals, ceramic compositions, and the like. Guide rollers 212 help guide flexible web 204 across surface 214 of support member 206. Support member 206 is cooled by cooling medium which enters support member 206 through supply line 216 and is withdrawn through drain line 218. Cooling effects of the cooling medium are imparted to portions of flexible web 204 in thermal contact with support member 206.

Coating operations are carried out using vapor transport tube 224. Vapor transport tube 224 helps transport vapor to flexible web 204 and helps shape the vapor stream for better coating performance. Vapor transport tube 224 is configured with two halves 203 and 205. Each half 203 and 205 includes a flange 207 and 209, respectively, at the mating ends to allow the halves to be releasably secured together by suitable fastening means such as screws, bolts, threaded engagement, and the like. The two halves 203 and 205 can be opened to allow access to chamber 222 for maintenance and inspection.

Vapor transport tube 224 has an inlet end 226 and an outlet end 228. Inlet end 226 is fitted with nozzle 230 through which streams of a fluid coating material and a carrier gas are ejected and collide within chamber 222 of vapor transport tube 224. Such collision results in the atomization and vaporization of the coating material. The coating material is supplied to nozzle 230 through supply line 232. Transport of material through supply line 232 is accomplished using metering pump 236. Carrier gas is supplied to nozzle 230 through supply line 234. Supply line 234 is fitted with flow regulator 235 and optional heat exchanger 238 in order to pre-heat the carrier gas before the carrier gas enters vapor transport tube 224. Heat may be supplied to chamber 222 using heating means such as heating element 240 to heat walls 242 of vapor transport tube 224. Heating element 240, shown schematically in FIG. 3, is in the form of an electrically resistive heating element that is helically wound around vapor transport tube 224 in thermal contact with walls 242 in order to provide the desired amount of heat.

Outlet end 228 of vapor transport tube 224 is provided with end cap 246 having orifice 244 through which vapor generated within chamber 222 is directed onto flexible web 204. End cap 246 may optionally be removable to allow access to chamber 222 for maintenance and inspection. When the vapor contacts chilled web 204, which is maintained at a temperature below the condensation temperature of the vapor, the vapor condenses to form a coating on web 204. After the coating is applied to moving web 204, the coating may be subjected to a suitable curing treatment, as schematically represented by curing unit 250. For example, as one option, curing unit 250 may be a source of radiant curing energy if the coating comprises radiation crosslinkable functionality. As another option, curing unit 250 may be an oven if the coating comprises thermally curable functionality.

FIG. 4 shows a particularly preferred system 300 of the present invention suitable for forming a radiation cured coating on a moveable web 302, wherein the coating is formed from one or more fluid, radiation crosslinkable coating materials. System 300 includes double-walled enclosure 304 including inner wall 306 and outer wall 308. Inner wall 306 defines coating chamber 310. Interior partition 312 divides coating chamber 310 into upper chamber 314 and lower chamber 316. Lower chamber 316 is maintained under an inert atmosphere due to the reactive nature of the radiation crosslinkable coating materials used to form the coating on web 302 as well as to help maintain a clean coating environment.

The inert atmosphere can be any gas or combinations of gases that are inert with respect to the materials being coated and post-condensation processing. Examples of suitable inert gases include nitrogen, helium, argon, carbon dioxide, combinations of these, and the like. The inert atmosphere may be supplied at any convenient temperature effective for carrying out coating operations. However, if the inert atmosphere is too hot or too cool, web temperature and/or vapor temperature may be more difficult to control. Generally, therefore, supplying the inert atmosphere at a temperature in the range from 0° C. to 100° C. would be suitable. The inert atmosphere is supplied to lower chamber 316 through gas entry ports 320 and is exhausted through gas exhaust ports 322. Lower chamber 316 is maintained under a slight positive pressure, e.g., 0.04 psig (250 Pa), to help exclude ambient gases, particulates, and other contaminants from lower chamber 316.

Flexible web 302 is guided around drum 324 (positioned in lower chamber space 316) from supply roll 326 (located in upper chamber space 314) to take up roll 328 (also located in upper chamber 314). Guide rollers 325 help guide web 302 during such transport. Preferably, drum 324 is a water-cooled, rotatable drum capable of rotating in the direction of arrow 330 in order to help transport web 302 around drum 324. Because of the very fine coating thicknesses that may be formed using the present invention, the surface 332 of drum 324 should be true (i.e. parallel to the drum axis) and smooth. A particularly preferred embodiment of a water-cooled drum 324 is cooled by circulating cooling water through a double helically wound cooling channel (not shown) located below, but proximal to, surface 332.

Drum 324 is maintained at a temperature below the condensation temperature(s) of at least a portion, and preferably all, of the radiation crosslinkable coating materials. Because the thermal mass of web 302 in thermal contact with drum 324 is relatively small as compared to that of drum 324, portions of the web in thermal contact with drum 324 will be cooled to a temperature substantially corresponding to the support member temperature. This helps ensure that the vapor coating materials condense onto web 302. The cooling temperature will vary depending upon the nature of the material(s) that are being coated. Typically, maintaining drum 324 at a temperature in the range from 0° C. to 80° C. would be suitable.

The rotational velocity of drum 324 preferably is adjustable so that coating speed can be optimized for each coating operation. Generally, a suitable speed range would allow coating to occur at web speed(s) in the range from 0.001 cm/s to 2000 cm/s, preferably 1 cm/s to 1000 cm/s, more preferably 1 cm/s to 300 cm/s.

Priming unit 336 optionally is provided on the infeed side of drum 324 in order to prime web 302. Such a treatment, although not always required, can be used in appropriate circumstances to improve adhesion of the coating to web 302. The type of priming treatment to be used is not critical, and any approach capable of adequately priming the surface of web 302 may be used. As one example, priming unit 336 may be a corona treatment unit capable of priming web 302 by directing a corona discharge at the web surface. Corona treatment units are commercially available from a number of commercial sources. For instance, a corona treatment apparatus commercially available from Pillar Technologies, Milwaukee, Wis., has been found to be suitable.

Coating vapor is directed onto web 302 from vapor transport tube 340. Vapor transport tube 340 includes main tube portion 341 and coating head portion 343. As an option, coating head portion 343 may be formed integrally with main tube portion or as a separate component that can be releasably secured to main tube portion 341. Alternatively, each of main tube portion 341 and coating head portion 343 may be independently formed from any of a variety of materials that would be inert with respect to the coating materials being used. Examples of such materials include glass, stainless steel, aluminum, copper, combinations of these, and the like. Preferably, main tube portion 341 comprises glass walls so that the quality of vaporization can be visually assessed. Coating head portion 343 may also be formed from glass or another suitable material, as desired.

Vapor transport tube 340 has an inlet end 342 and an outlet end 344. Inlet end 342 is fitted with nozzle 346 through which respective streams of a radiation curable coating material and a carrier gas are ejected and collide within chamber 348 of vapor transport tube 340. Such collision results in the atomization and vaporization of the coating material. The coating material is supplied to nozzle 346 through supply line 350, and the carrier gas is supplied to nozzle 346 through supply line 352. Supply line 350 includes positive displacement or metering pump 354. Supply line 352 is fitted with heat exchanger 356 in order to heat the gas. Heat may be supplied to chamber 348 using any suitable heating means (not shown) such as is described above.

The flow rate of coating materials and carrier gas through nozzle 346 is one factor affecting coating performance. Generally, the flow rate of carrier gas is greater than that of the coating materials to ensure that all of the coating materials can vaporize without the carrier gas becoming saturated with vapor. In a typical coating operation, coating materials may be supplied at a flow rate in the range of 0.01 ml/min to 50 ml/min, and the carrier gas may be supplied at a flow rate of 4 l/min to 400 l/min. The ratio of the carrier gas flow rate to the coating material flow rate is typically in the range from $10^3$ to $10^6$.

Outlet end 344 of vapor transport tube 340 is provided with orifice 360 through which vapor generated within chamber 348 is directed onto web 302. When the vapor contacts the chilled web 302, which is maintained at a temperature below the condensation temperature of the vapor, the vapor condenses to form a coating on web 302. After the condensed coating is applied to the moving web 302, the coating may be subjected to suitable curing conditions, as schematically represented by radiation curing unit 362. The coated web may then be processed further if desired, or as shown, stored on take up roll 328.

FIGS. 5*a*, 5*b*, and 5*c* show one embodiment of a particularly preferred nozzle 400 for use in practicing the principles of the present invention. Nozzle 400 can be incorporated into any embodiment of the present invention, including any of the embodiments described above. Nozzle 400 includes, as main components, main barrel 402, end cap 404, adapter 406, and outlet cover 408. These main components are adapted to be assembled using threadable engagement, making it easy to disassemble and reassemble nozzle 400 as needed for maintenance and inspection.

Main barrel 402 includes conical head 405 coupled to cylindrical body 407 in such a manner as to provide shoulder face 409. At the other end of body 407, outer cylindrical wall 410 extends longitudinally from an outer periphery 412 of body 407. Inner cylindrical wall 414 extends longitudinally from an interior portion 416 of body 407. The length of inner cylindrical wall 414 is greater than that of outer cylindrical wall 410 so that end cap 404 can be threadably engaged over inner cylindrical wall 414 to sealingly engage outer cylindrical wall 410 at juncture 418. Inner cylindrical wall 414 and outer cylindrical wall 410 are spaced apart from each other so as to define gap 420 which forms a part of annular chamber 422 (see FIG. 5*c*) when main barrel 402 and end cap 404 are assembled with body 407. The outer surface 424 of body 407 is threaded and sized for threadable engagement with adapter 406. The outer surface 426 of inner cylindrical wall 414 is also threaded and sized for threadable engagement with end cap 404.

At least one through aperture 428 is provided in body 407 in order to provide fluid communication between gap 420, and hence annular chamber 422, and shoulder face 409. In the preferred embodiment shown, four apertures 428 are provided and are spaced equidistantly around shoulder face 409. Main barrel 402 further includes a through aperture 429 extending longitudinally along the axis of main barrel 402 from inlet end 421 positioned on inner cylindrical wall 414 to discharge end 423 positioned on conical head 405. Through aperture 429 is generally cylindrical, but tapers to a reduced diameter at discharge end 423. Preferably, through aperture 429 has sufficient land length and orifice diameters at ends 421 and 423 to achieve laminar flow.

End cap 404 generally includes end wall 430 and a peripheral side wall 432. End wall 430 has a centrally located aperture 434 adapted to fit over and threadably engage inner cylindrical wall 414 of main barrel 402. When end cap 404 and main barrel 402 are assembled by threadable engagement, as shown best in FIG. 5*c*, side wall 432 sealingly engages outer cylindrical wall 410 of main barrel 402 at juncture 418, but is spaced apart from inner cylindrical wall 414. Side wall 432 thus helps define annular chamber 422 surrounding an initial portion of inner cylindrical wall 414 proximal to inlet end 421. Side wall 412 includes an aperture 435 that provides a connection between the exterior of nozzle 400 and annular chamber 422 when nozzle 400 is assembled. Outer surface 436 of end cap 404 is knurled to help provide a good grip against end cap 404 during assembly and disassembly of nozzle 400.

Adapter 406 includes conical head 440 with flat end face 442 coupled to body 444 in a manner so as to provide outer shoulder 446. At the other end of body 444, cylindrical wall 448 extends longitudinally from an outer periphery 450 of body 444. Outer surface 452 of body 444 is threaded and sized for threadable engagement with outlet cover 408. Inner surface 453 of cylindrical wall 448 is threaded and sized for threadable engagement with body 407 of main barrel 402. Outer surface 454 of cylindrical wall 448 is knurled to help provide a good grip against adapter 406 during assembly and disassembly of nozzle 400.

Body 444 and conical head 440 are provided with tapered through aperture 456 for receiving conical head 405 of main barrel 402. Inner shoulder 455 spans the distance between edge 457 of through aperture 456 and inner surface 452 of cylindrical wall 448. Conical head 405 is sealingly received in tapered through aperture 456 in a manner such that discharge end 423 of conical head 405 just protrudes from end face 442. Additionally, when conical head 405 is fully inserted into through aperture 456, shoulder face 409 of main barrel 402 is spaced apart from inner shoulder 455, thereby defining secondary annular chamber 458. Body 444 includes a plurality of arcuate through recesses 460 that provide fluid communication between inner shoulder 455 and outer shoulder 446. Arcuate through recesses 460 are connected with through apertures 428 of main barrel 402 via secondary annular chamber 458. Arcuate through recesses 460 distribute the substantially linear, streamlined flow emerging from apertures 428 into a generally annularly shaped flow pattern emerging from arcuate recesses 460.

Outlet cover 408 includes end portion 470 and side wall 472. Inner surface 474 of side wall 472 is threaded and sized for threadable engagement with body 444 of adapter 406. Outer surface 476 of side wall 472 is knurled to help provide a good grip against the outlet cover during assembly and disassembly of nozzle 400. End portion 470 is provided with inner wall 480 defining tapered through aperture 478 which is adapted to receive tapered head 440 of adapter 406 in a gapped manner so as to define conical passageway 482 extending between inner wall 480 and tapered head 440. Passageway 482 thus has an inlet 484 proximal to arcuate through recesses 460 and an outlet 485 proximal to end face 442. Outlet 485 is annularly shaped and surrounds discharge end 423 of through aperture 429.

In a preferred mode of operation of nozzle 400, a supply of coating material enters inlet end 421 of through passage 429 and then flows to discharge end 423 where a stream of the coating material is ejected along the longitudinal axis of nozzle 400 toward collision point 490 preferably in a laminar state. In the meantime, a supply of a carrier gas enters annular chamber 422 through aperture 435. The flow of carrier gas is then constricted as the carrier gas flows from annular chamber 422 to secondary annular chamber 458 through passageways 428. From secondary annular chamber 458, the flow of carrier gas enters arcuate passageways 460, whereby the constricted flow from passages 428 is redistributed to form a substantially annularly shaped flow. From arcuate passageways 460, the flow of carrier gas is again restricted in tapered passageway 482 and then is ejected as a conically-shaped, hollow stream toward the collision point 490. At collision point 490, the streams of coating material and carrier gas collide, atomizing and vaporizing the coating material.

Figure 6:
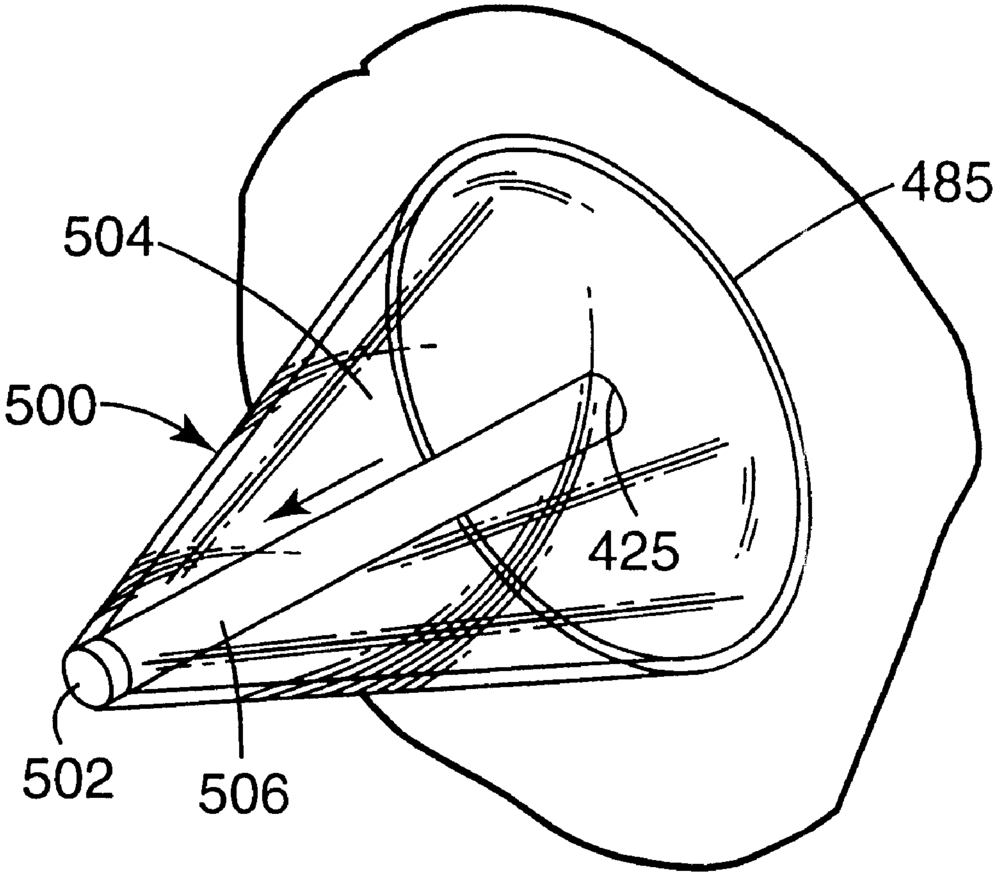
FIG. 6 is a perspective view, with parts broken away, for purposes of illustration, of the fluid and carrier gas streams generated by the assembled nozzle of FIG. 5*c*.

FIG. 6, with reference to nozzle features shown in FIGS. 5*a*, 5*b*, and 5*c*, illustrates the geometry of colliding fluid and gas streams generated by using nozzle 400 in more detail. Hollow, substantially cone-shaped stream 500 of carrier gas, having interior region 504, emerges from annular orifice 485 of nozzle 400 and converges towards apex 502. Orifice 425, located in approximately the center of annular orifice 485, ejects a cylindrical stream 506 of fluid through interior region 504 and towards apex 502, where streams 500 and 506 collide. Fluid stream 506 is thereby atomized with great force.

This approach provides many performance advantages. Firstly, the structure of nozzle 400 makes it easier to atomize fluid streams comprising sticky or relatively viscous fluid materials. Relatively low pressures are required to motivate such fluid components through nozzle 400, and such components surprisingly show a reduced tendency to plug nozzle 400 as compared to atomizing configurations using other nozzle structures. While not wishing to be bound by theory, a possible rationale to explain this improved performance can be suggested. It is believed that the rapidly moving, hollow, cone-shaped stream 500 of carrier gas develops a vacuum in interior region 504 that helps pull the fluid composition through nozzle 400. This pulling force helps overcome the viscous and sticky effects that might otherwise result in nozzle plugging. As another advantage, this approach provides excellent atomization of fluid stream 506 in that carrier gas stream 500 collides with fluid stream 506 around substantially the entire periphery of fluid stream 506 with great force.

In some applications, it may be desirable to generate a homogeneous vapor from two or more liquid compositions that are sufficiently incompatible with each other so that use of nozzle 400 may not be optimal for forming homogenous, atomized and/or vaporized blends of such components. The use of nozzle 400 may be less than optimal, for instance, if the liquid materials to be processed include two or more immiscible components that will not flow through nozzle 10 in a homogeneous fashion. Alternatively, the use of nozzle 400 may be less than optimal in instances in which the liquid materials include two or more components that are so reactive with each other in the liquid state that transporting such materials through nozzle 400 in a single stream could cause nozzle 400 to become plugged.

In these kinds of circumstances, FIG. 7 shows a particularly preferred embodiment of a nozzle 400' of the present invention that is especially useful for forming homogeneous atomized and/or vaporized blends from a plurality of liquid streams. Nozzle 400' is generally identical to nozzle 10, except that main barrel 402 includes not just one through aperture 429 but a plurality of through apertures 429' for handling multiple fluid streams at the same time. For purposes of illustration, three through apertures 429' are shown, but a greater or lesser number could be used depending upon how many fluid streams are to be handled. For instance, in other embodiments, main barrel 402' might include from 2 to 5 of such through apertures 429'. Nozzle 400' also includes tubing 431' in order to supply respective fluid streams for each such through aperture 429'. Nozzle 400' is thus able to provide substantially simultaneous, implosive, energetic atomization and vaporization of multiple fluid streams. This approach provides a vapor with substantially better homogeneity than if one were to attempt to generate and then mix multiple vapors from multiple nozzles.

The present invention will now be further described with reference to the following examples:

EXAMPLE 1

A liquid stream was atomized, vaporized, and condensed onto a substrate, on which it was later polymerized, as follows: A liquid stream, composed of a solution of 5.3 parts by weight 1,6-hexanediol diacrylate (available from UCB Chemicals), having a boiling point of 295° C. at standard pressure, and 94.7 parts by weight perfluorooctylacrylate (available as FC 5165 from Minnesota Mining and Manufacturing Company), having a boiling point of 100° C. at 10 mm Hg (1400 Pa), was conveyed with a syringe pump (Model 55-2222 available from Harvard Apparatus) through the atomizing nozzle depicted in FIGS. 5*a*, 5*b*, and 5*c*. A gas stream (cryogenic-grade nitrogen, available from Praxair) at 0.35 mPa (34 psi) was heated to 127° C. and passed through the nozzle. The liquid stream moved at a rate of 0.5 ml/min and the gas stream moved at a rate of 27 l/min (standard temperature and pressure or "STP"). Both the liquid stream and the gas stream passed through the nozzle along separate channels as described above in the discussion of FIGS. 5*a*, 5*b*, and 5*c*. The gas stream exited an annular orifice directed at a central apex located 3.2 mm (0.125 inch) from the end of the nozzle. At that location, the gas stream collided with the central liquid stream. The liquid stream was atomized to form a mist of liquid droplets in the gas stream. The atomized liquid droplets in the gas stream then vaporized quickly as the flow moved through the vapor transport chamber. The vapor transport chamber was comprised of two parts, a glass pipe having a diameter of 10 cm and a length of 5 cm and an aluminum pipe having a 10 cm diameter and a 25 cm length. The exit end of the nozzle extended approximately 16 mm (0.64 inch) into one end of the glass pipe and the aluminum pipe was joined to the other end of the glass pipe. The aluminum pipe was heated with heating tape that was wrapped around the outside of the pipe to prevent condensation of the vapor onto the walls of the vapor transport chamber.

The vaporization was observed by two methods. The first method involved visual observation with the naked eye, and the second involved laser light scattering. When observed with the naked eye, the atomized droplets were visible as a fine mist confined to a narrow conical region extending less than two centimeters from the outlet of the nozzle. After this, the mist could not be seen, indicating complete vaporization beyond that region. The atomization and vaporization of the liquid was also observed by shining laser light from a "pen-light' laser (Opti™ from Lyte Optronics, Inc.), with a wavelength of 630–670 nm, into the glass portion of the vapor transport chamber. The laser light was visible as scattered light from the droplets present less than two centimeters from the outlet of the nozzle. The rest of the vapor transport chamber was clear, indicating complete vaporization of the liquid or at least reduction of the droplets to diameters of less than the detection limit of less than 30 nm.

The vapor and gas mixture exited the outlet of the vapor transport chamber through a slot at the end of the aluminum pipe. The slot had a length of 50 mm and a width of 1.3 mm (2 in. by 0.05 in.). The temperature of the vapor and gas mixture was 136° C. at a position 3 cm before the outlet of the vapor transport chamber. A substrate, a biaxially-oriented polyethylene terephthalate film having a thickness of 100 microns and a width of 23 cm, was conveyed past the vapor transport outlet by a mechanical drive system that controlled the rate of motion of the film at 1.0 cm/s. The film passed over a water-cooled plate while the mixture of vapor and gas contacted the film. The gap between the vapor outlet and the cooled plate was about 2 mm. The vapor in the gas and vapor mixture condensed onto the film, forming a strip of wet coating having a width of 50 mm (2 inches).

The coating was then free-radically polymerized by passing the coated film under a 222 nm monochromatic ultraviolet lamp system (available as Noblelight Excimer Labor-System 222 from Heraeus, Germany) in a nitrogen atmosphere. The lamp had an irradiance of 30 mW/cm$^2$ and the film speed was approximately 2.1 meters per min. (7 fpm).

EXAMPLE 2

A substrate was coated and cured as in Example 1 except the substrate speed during condensation coating was 2.6 cm/s, the temperature of the nitrogen entering the nozzle was 150° C., and the temperature of the vapor and gas mixture was 142° C. at a position 3 cm before the outlet of the vapor transport chamber.

EXAMPLE 3

A substrate was coated and cured as in Example 1 except the substrate speed during condensation coating was 8.9 cm/s, the temperature of the nitrogen entering the nozzle was 122° C., and the temperature of the vapor and gas mixture was 127° C. at a position 3 cm before the outlet of the vapor transport chamber.

EXAMPLE 1–3 RESULTS

The polymerized coatings of Examples 1–2 were solid, clear, and slightly visible to the naked eye. However, when each coating was held under light at an angle, an iridescent pattern was observed that was generally associated with a substantially complete coating without significant voids having a thickness of less than 1 micrometer. The polymerized coating of Example 3 was not visible to the naked eye. Each coating was analyzed by X-ray photoelectron spectroscopy and attenuated total internal-reflectance infrared spectroscopy to confirm the presence of both the fluorocarbon acrylate and the crosslinker in the coating; thus confirming that both components of the liquid stream had vaporized and condensed.

EXAMPLE 4

A substrate was coated in a manner similar to that of Example 1 except a different liquid and different process conditions were used. The vapor transport chamber and exit slot were also different, and the coating was not cured. The liquid stream was composed of a fluorocarbon liquid (available as Fluorinert™ FC-43 from Minnesota Mining and Manufacturing Co.) with a boiling point at atmospheric pressure of 174° C. The liquid flowrate was 1.0 ml/min and the nitrogen flowrate was 25 l/min (STP). The nitrogen temperature was near 100° C. as it entered the nozzle. The vapor transport chamber was composed of a glass pipe having a 10 cm diameter and a 23 cm length and was heated with heating tape wrapped around the outside of the pipe to prevent condensation of the vapor onto the walls of the vapor transport chamber. Laser light was scattered less than 1 cm from the outlet, but not after the first centimeter. The vapor and gas mixture was 90° C. at a position 3 cm before the outlet of the vapor transport chamber. The slot at the end of the aluminum pipe had a length of 9 cm and a width of 1 cm (3.5 in. by 0.4 in.). The substrate was placed about 5 mm from the vapor transport outlet slot for about two seconds.

EXAMPLE 5

A substrate was coated as in Example 4, except the liquid flowrate was 2.0 ml/min, the temperature of the vapor and gas mixture was 94° C. at a position 3 cm before the outlet of the vapor transport chamber, and the mist was visible and scattered the laser light in the region less than 3 cm from the outlet of the nozzle.

EXAMPLE 6

A substrate was coated as in Example 4, except the liquid flowrate was 10.0 ml/min, the temperature of the vapor and gas mixture was 99° C. at a position 3 cm before the outlet of the vapor transport chamber, and the mist was visible and scattered the laser light in the region less than 22 cm from the outlet of the nozzle.

EXAMPLES 4–6 RESULTS

The coatings of Examples 4–6 were liquid. When the coatings of Examples 4 and 5 were held under light at an angle, an iridescent pattern was observed that was generally associated with a substantially complete coating without significant voids having a thickness of less than 1 micrometer. The coating of Example 6 appeared much thicker and did not have an iridescent pattern.

EXAMPLE 7

A substrate was coated as in Example 4, except a different gas, nozzle, and process conditions were used. The gas was compressed air and moved at a rate of 4 l/min (STP). The nozzle was available as Sonicair™ nozzle from IVEK Corp., Vermont. The liquid stream and gas stream were mixed in the nozzle and exited the nozzle through an orifice with a diameter of 0.05 cm (0.020 inch). The liquid was atomized as the mixture exited the nozzle. The atomized liquid droplets, in contact with the gas stream, vaporized quickly as they entered the vapor transport chamber that was composed of an aluminum pipe having a diameter of 11 cm, a length of 30 cm, and heating tape wrapped around its outer surface. The exit end of the nozzle extended approximately 13 mm (0.5 inch) into the aluminum pipe. The atomization and vaporization were viewed through the outlet slot into the vapor transport chamber. The atomized droplets and the laser light were visible as a fine mist and a light scatter, respectively, confined to a region near the outlet of the nozzle. The temperature of the vapor and gas mixture was 85° C. at a position 5 cm before the outlet of the vapor transport chamber.

The coating of Example 7 was liquid. When the coated substrate was held under light at an angle, an iridescent pattern was observed.

EXAMPLE 8

A substrate could be coated in a manner similar to that of Example 1, except that a photoinitiator would be added, the coatings would be wider, and different lamps would be used to generate ultraviolet light. The photoinitiator would be acetophenone available from Aldrich Chemical Co. and would be present in about 1 part per hundred parts of the difunctional monomer 1,6-hexanediolacrylate, having a boiling point of 295° C. at STP. The vapor would then be condensed onto the substrate in a system as depicted in FIG. 4. The vapor and gas mixture would exit the outlet of the coating head through a slot of length 25 cm. The substrate, having a width of 30 cm, would be transported past a corona electrode assembly in a nitrogen atmosphere and then the coating head outlet while in contact with a metal chill roll of diameter 41 cm (16 in) and width 36 cm (14 in). The chill roll would be cooled by water from a chiller. The corona electrode assembly would have three ceramic tube electrodes (available from Sherman Treater, Ltd., UK), each with an active length of 30 cm (12 in) and spaced 2 mm from the film. The discharge would be powered by a corona generator (model RS-48B, available from ENI Power Systems, Rochester, N.Y.). The nitrogen for the corona discharge would enter the back of the electrode assembly and flow past the electrodes into the discharge region. The gap between the vapor outlet and the cooled plate would be about 2 mm. The vapor in the gas and vapor mixture would condense onto the film, forming a strip of wet coating having a width of about 25 cm. The ultraviolet lamp system would be a high intensity mercury arc lamp.

The polymerized coating of Example 8 would be solid, clear, and slightly visible to the naked eye but have an iridescent pattern under reflected light.

EXAMPLE 9

A substrate could be coated in a manner similar to that of Example 8, except that a different liquid could be used, no photoinitiator would be present, the substrate would be different, and the ultraviolet light source and conditions would be as in Example 1. The liquid stream would be a solution of 2 parts by weight of acrylic acid (available from Sigma-Aldrich Corp., Milwaukee, Wis.), having a boiling point at atmospheric pressure of 139° C., and 98 parts by weight isooctylacrylate (available as SR440 from Sartomer, Exton, Pa.) having a boiling point at standard pressure of 216° C. The substrate would be biaxially oriented polypropylene having a thickness of about 50 micrometers.

The polymerized coating of Example 9 would be solid, clear, and slightly visible to the naked eye but have an iridescent pattern under reflected light.

EXAMPLE 10

A substrate could be coated in a manner similar to that of Example 8, except that a different liquid could be used, no photoinitiator would be present, the substrate would be different, and a different polymerization mechanism would be used. The liquid stream would be a solution of 99 parts by weight of a condensation polymerizable material, mercaptopropyltrimethoxysilane (available from Sigma-Aldrich Corp.), having a boiling point at standard pressure of 212° C., and 1 part by weight amine catalyst (available as Jeffcat ZR-50 from Huntsman) having a boiling point at atmospheric pressure of 290° C. The substrate would be silica-primed biaxially oriented polypropylene having a thickness of about 50 micrometers. The silica-primed film would be prepared as described in U.S. Pat. No. 5,576,076 (Slootman, et al.). The coating would be polymerized by standing in air for several days.

The coating would be hard, clear and slightly visible.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. A method of forming a coating on at least a portion of a surface of a substrate, comprising the steps of:

(a) causing a stream of a carrier gas to collide with a stream of a fluid composition said colliding occurring at a carrier gas velocity substantially higher than the fluid stream velocity, the ratio of carrier gas velocity to fluid stream velocity being sufficient to cause vaporization of substantially all of the fluid composition to form a vapor having a condensation temperature;

(b) causing the vapor to flow to the surface of the substrate, said surface being at a temperature below the condensation temperature of the vapor; and (c) condensing the vapor as a liquid on the surface to form the coating.

2. The method of claim 1, wherein the fluid composition is substantially nonreactive with respect to the carrier gas.

3. The method of claim 1, wherein said vapor is a first vapor and the method further comprises the steps of:

(1) causing a stream of a second carrier gas to collide with a second stream of a second fluid composition, said colliding occurring under conditions such that vaporization of substantially all of the second fluid composition occurs to form a second vapor having a second condensation temperature;

(2) causing the vapor to flow to the surface of the substrate, which surface is at a temperature below the condensation temperature of the vapor; and (3) condensing the second vapor on the surface to form a part of the coating.

4. The method of claim 3, wherein said first and second vapors are blended prior to step (c).

5. The method of claim 3, wherein said first and second vapors are sequentially condensed on the surface of the substrate.

6. The method of claim 1, wherein the fluid composition comprises at least one fluid component having radiation crosslinkable functionality.

7. The method of claim 1, wherein the fluid composition comprises at least first and second components capable of reacting with each other such that the coating formed on the substrate comprises a reaction product derived from said first and second components.

8. The method of claim 1, wherein the carrier gas is at an elevated temperature that is below the boiling point of at least one component of the fluid composition.

9. The method of claim 1, wherein the vapor in step (b) is formed in a chamber having an entrance end at which said colliding occurs, and said substrate is supported within the chamber, said chamber being maintained at a temperature above the condensation temperature of the vapor.

10. The method of claim 1, wherein the vapor in step (b) flows through a chamber having an entrance end at which said colliding occurs and a discharge end having an orifice through which the vapor is directed onto the surface of the substrate, said chamber being maintained at a temperature above the condensation temperature of the vapor.

11. The method of claim 1, wherein step (a) comprises ejecting the streams of carrier gas and fluid composition through at least first and second orifices, respectively, of a nozzle such that said streams collide.

12. The method of claim 11, wherein:

(a) the first orifice is annularly shaped and is adapted to eject a hollow, substantially conically-shaped stream of carrier gas that tapers inward towards an apex as the carrier gas stream travels away from said first orifice, said stream of carrier gas having an interior region, and (b) the second orifice is adapted to eject the stream of fluid composition through the interior region of the carrier gas stream to a collision with the carrier gas stream substantially at the apex.

13. The method of claim 1 in which the fluid composition is selected from the group consisting of fluoropolyether monomers, oligomers, and polymers and organofunctional silanes.

14. The method of claim 1 in which steps (a)–(c) take place at a pressure which is not a vacuum.

15. A method of forming a coating on at least a portion of a surface of a substrate, comprising the steps of:

(a) atomizing a fluid composition;

(b) colliding the atomized fluid composition with a carrier gas, said colliding occurring at a carrier gas velocity substantially higher than the velocity of the atomized fluid, the ratio of carrier gas velocity to atomized fluid velocity being sufficient to cause vaporization of substantially all of the atomized fluid composition to form a vapor having a condensation temperature, (c) causing the vapor to flow to the surface of the substrate, said surface being at a temperature below the condensation temperature of the vapor; and (d) condensing the vapor as a liquid onto the surface to form the coating.

16. The method of claim 15, wherein the fluid composition contains substantially no solvent.

17. The method of claim 15, wherein said vapor is a first vapor and the method further comprises the steps of:

(1) atomizing a second fluid composition;

(2) contacting the atomized second fluid composition with a second carrier gas, said contacting occurring under conditions such that vaporization of substantially all of the atomized second fluid composition occurs to form a second vapor having a second condensation temperature;

(3) causing the second vapor to flow to the surface of the substrate, said surface being at a temperature below the condensation temperature of the second vapor; and (4) condensing the second vapor onto the surface to form a part of the coating.

18. The method of claim 17, wherein said first and second vapors are blended prior to step (d).

19. The method of claim 17, wherein said first and second vapors are sequentially condensed on the surface of the substrate.

20. The method of claim 15, wherein the fluid composition is substantially nonreactive with respect to the carrier gas.

21. The method of claim 15, wherein the fluid composition comprises at least first and second components capable of reacting with each other such that the coating formed on the substrate comprises a reaction product derived from said first and second components.

22. The method of claim 15, wherein the carrier gas is at an elevated temperature that is below the boiling point of at least one component of the fluid composition.

23. The method of claim 15, wherein the vapor in step (b) is formed in a chamber having an entrance end at which said contacting occurs, and said substrate is supported within the chamber, said chamber being maintained at a temperature above the condensation temperature of the vapor.

24. The method of claim 15, wherein the vapor in step (b) flows through a chamber having an entrance end at which said contacting occurs and a discharge end having an orifice through which the vapor is directed onto the surface of the substrate, said chamber being maintained at a temperature above the condensation temperature of the vapor.

25. The method of claim 15 in which the fluid composition is selected from the group consisting of fluoropolyether monomers and oligomers, and organofunctional silanes.

26. The method of claim 15 in which steps (a)–(d) occur at a pressure which is not a vacuum.

27. A method of forming a polymeric coating on at least a portion of a surface of a substrate, comprising the steps of:

(a) atomizing a fluid composition comprising one or more polymeric precursor components;

(b) colliding the fluid composition with a carrier gas, said colliding occurring under conditions such that vaporization of substantially all of the atomized fluid composition occurs;

(c) causing the vapor to flow to the surface of the substrate, which surface is at a temperature below the condensation temperature of the vapor; and (d) condensing the vapor as a liquid on the surface to form the coating.

28. The method of claim 27, wherein the fluid composition contains substantially no solvent.

29. The method of claim 27, wherein said vapor is a first vapor and the method further comprises the steps of:

(1) atomizing a second fluid composition;

(2) contacting the atomized second fluid composition comprising one or more polymer precursors with a second carrier gas, said contacting occurring under conditions such that vaporization of substantially all of the atomized second fluid composition occurs to form a second vapor having a second condensation temperature; and (3) causing the second vapor to flow to the surface of the substrate, said surface being at a temperature below the condensation temperature of the second vapor.

30. The method of claim 29, wherein said first and second vapors are blended prior to step (d).

31. The method of claim 27, wherein the fluid composition comprises at least one radiation curable component, and wherein the method further comprises the step of irradiating the condensed vapor with a dosage of radiant curing energy effective to solidify the coating.

32. The method of claim 27, wherein the fluid composition comprises a curable polymeric coating precursor, and a quantity of a curing agent effective to facilitate curing of the polymeric coating precursor.

33. The method of claim 27, wherein the fluid composition is substantially nonreactive with respect to the carrier gas.

34. The method of claim 27, wherein the fluid composition comprises at least first and second components capable of reacting with each other such that the polymeric coating formed on the substrate comprises a polymeric reaction product derived from said first and second components.

35. The method of claim 27, wherein the carrier gas is at an elevated temperature that is below the boiling point of at least one component of the fluid composition.

36. The method of claim 27, wherein the vapor in step (b) is formed in a chamber having an entrance end at which said colliding occurs, and said substrate is supported within the chamber, said chamber being maintained at a temperature above the condensation temperature of the vapor.

37. The method of claim 27, wherein the vapor in step (b) flows through a chamber having an entrance end at which said colliding occurs and a discharge end having an orifice through which the vapor is directed onto the surface of the substrate, said chamber being maintained at a temperature above the condensation temperature of the vapor.

38. The method of claim 27, wherein step (b) comprises ejecting the carrier gas through a first orifice of a nozzle and ejecting the fluid composition through a second orifice of the same nozzle, of which:

(a) the first orifice is annularly shaped and is adapted to eject a hollow, substantially conically-shaped stream of carrier gas that tapers inward towards an apex as the carrier gas stream travels away from said first orifice, said stream of carrier gas having an interior region, and (b) the second orifice is adapted to eject the stream of fluid composition through the interior region of the carrier gas stream to a collision with the carrier gas stream substantially at the apex.

39. The method of claim 27 in which at least one of the polymeric precursor components is selected from the group consisting of fluoropolyether monomers and oligomers, and organofunctional silanes.

40. The method of claim 27 in which steps (a)–(d) occur at a pressure which is not a vacuum.

* * * * *

UNITED STATES PATENT AND TRADEMARK OFFICE

CERTIFICATE OF CORRECTION

PATENT NO. : 6,045,864
DATED : April 4, 2000
INVENTOR(S) : Lyons et al.

It is certified that error appears in the above-identified patent and that said Letters Patent is hereby corrected as shown below:

Column 10,
Line 9, " 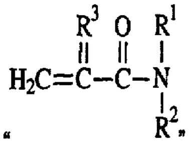 ", should read -- 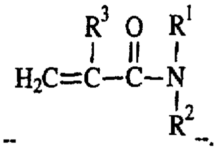 --.

Column 9,
Line 48, after "an" insert -- ∝ --.
Line 51, after "an" insert -- ∝ --.

Signed and Sealed this

Thirteenth Day of November, 2001

Attest:

Nicholas P. Godici

NICHOLAS P. GODICI

*Attesting Officer*

*Acting Director of the United States Patent and Trademark Office*